US011394400B2

(12) United States Patent
Chen et al.

(10) Patent No.: US 11,394,400 B2
(45) Date of Patent: Jul. 19, 2022

(54) WIRELESS COMMUNICATION DATA PROCESSING METHOD AND APPARATUS FOR REDUCING BIT ERROR RATE

(71) Applicant: Huawei Technologies Co., Ltd., Shenzhen (CN)

(72) Inventors: Jun Chen, Beijing (CN); Yong Xie, Shenzhen (CN); Jie Jin, Moscow (RU); Yinggang Du, Shenzhen (CN); Guijie Wang, Hangzhou (CN); Rongdao Yu, Shenzhen (CN); Gongzheng Zhang, Hangzhou (CN); Rong Li, Hangzhou (CN); Wei Chen, Hangzhou (CN); Jun Wang, Hangzhou (CN); Chen Xu, Hangzhou (CN); Anahid Robert Safavi, Kista (SE); Alberto Giuseppe Perotti, Segrate (IT); Branislav M. Popovic, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 273 days.

(21) Appl. No.: 16/716,188

(22) Filed: Dec. 16, 2019

(65) Prior Publication Data

US 2020/0119845 A1    Apr. 16, 2020

Related U.S. Application Data

(63) Continuation of application No. PCT/CN2018/091889, filed on Jun. 19, 2018.

(30) Foreign Application Priority Data

Jun. 16, 2017   (CN) .......................... 201710459416.3
Jun. 17, 2017   (CN) .......................... 201710459780.X
Sep. 8, 2017    (WO) ................. PCT/EP2017/072643

(51) Int. Cl.
*H03M 13/27*   (2006.01)
*H04L 27/36*   (2006.01)
(Continued)

(52) U.S. Cl.
CPC ... *H03M 13/2792* (2013.01); *H03M 13/1102* (2013.01); *H03M 13/2707* (2013.01);
(Continued)

(58) Field of Classification Search
CPC ..... H04L 1/0063; H04L 1/0071; H04L 27/36; H04L 27/364; H04L 1/00; H03M 13/2792;
(Continued)

(56) References Cited

U.S. PATENT DOCUMENTS 5,218,020 A * 6/1993 Tung ...................... C08L 21/00
                                                    524/55
8,171,374 B2 * 5/2012 Miyazaki ........... H03M 13/1168
                                                    714/758
(Continued)

FOREIGN PATENT DOCUMENTS

CA    2943041 C  * 12/2018   ........ H03M 13/2707
CN    1335722 A     2/2002
(Continued)

OTHER PUBLICATIONS

"A Low Power Layered Decoding Architecture for LDPC Decoder Implementation for IEEE 802.11n LDPC Codes"; Jin et al.; ISLPED'08, Aug. 11-13, 2008, Bangalore, India. (Year: 2008).*
(Continued)

*Primary Examiner* — Benjamin H Elliott, IV
(74) *Attorney, Agent, or Firm* — Leydig, Voit & Mayer, Ltd.

(57) ABSTRACT

A data processing method and a data processing apparatus are provided to reduce a bit error rate of a wireless com-
(Continued)

munications system and improve transmission performance of the wireless communications system. The method includes: mapping L to-be-sent bits to L bit locations included in at least one modulation symbol, where the L to-be-sent bits include at least one bit field, a bit in a bit field having a high priority is preferentially mapped to a bit location that is of the at least one modulation symbol and that has a high reliability level, the at least one bit field is at least one of an information bit field, a first parity bit field, and a second parity bit field; and outputting the at least one modulation symbol.

16 Claims, 18 Drawing Sheets

(51) Int. Cl.
*H03M 13/11* (2006.01)
*H03M 13/00* (2006.01)
*H04L 1/00* (2006.01)

(52) U.S. Cl.
CPC ........ *H03M 13/635* (2013.01); *H04L 1/0063* (2013.01); *H04L 1/0071* (2013.01); *H04L 27/36* (2013.01); *H04L 27/364* (2013.01)

(58) Field of Classification Search
CPC ......... H03M 13/1102; H03M 13/2707; H03M 13/635; H03M 13/356; H03M 13/116; H03M 13/255; H03M 13/271; H03M 13/6306; H03M 13/6393
See application file for complete search history.

(56) References Cited

U.S. PATENT DOCUMENTS

| | | | | |
|---|---|---|---|---|
| 8,498,357 B2* | 7/2013 | Jung | ..................... | H04L 1/0071 375/267 |
| 9,300,517 B2* | 3/2016 | Park | ..................... | H04L 27/183 |
| 9,769,591 B2* | 9/2017 | Nguyen | ................. | H04W 4/70 |
| 9,819,445 B1* | 11/2017 | Patel | ..................... | H04L 1/0052 |
| 9,893,842 B2* | 2/2018 | Eder | ..................... | H04L 1/1845 |
| 10,305,633 B2* | 5/2019 | Manolakos | ........... | H04L 5/0007 |
| 10,355,820 B2* | 7/2019 | Park | .................. | H03M 13/3746 |
| 10,595,311 B2* | 3/2020 | Gupta | .................. | H04L 5/0057 |
| 10,680,764 B2* | 6/2020 | Young | .................. | H04L 1/1819 |
| 10,728,080 B2* | 7/2020 | Sankar | ................ | H03M 13/356 |
| 2002/0199147 A1* | 12/2002 | Kim | ..................... | H04L 1/0071 714/748 |
| 2003/0081690 A1* | 5/2003 | Kim | ..................... | H04L 1/1819 375/264 |
| 2003/0159100 A1* | 8/2003 | Buckley | ................ | H04L 1/1816 714/758 |
| 2007/0002969 A1* | 1/2007 | Jeong | .................. | H04L 27/3405 375/298 |
| 2008/0219387 A1* | 9/2008 | Choi | ..................... | H04L 1/0086 375/346 |
| 2009/0060094 A1* | 3/2009 | Jung | ..................... | H04L 1/0003 375/340 |
| 2009/0063929 A1* | 3/2009 | Jeong | .................. | H04L 27/3488 714/752 |
| 2009/0100300 A1* | 4/2009 | Kim | ..................... | H04L 1/0042 714/702 |
| 2009/0249166 A1* | 10/2009 | Miki | ..................... | H04L 1/0033 714/762 |
| 2011/0142163 A1* | 6/2011 | Kwon | .................. | H04L 25/067 375/295 |
| 2013/0117622 A1* | 5/2013 | Blankenship | ........... | H04L 1/007 714/751 |
| 2014/0177756 A1* | 6/2014 | Park | ..................... | H04L 1/0009 375/298 |
| 2015/0131427 A1* | 5/2015 | Han | ..................... | H04J 11/005 370/210 |
| 2015/0263825 A1* | 9/2015 | Kim | ..................... | H04L 1/0013 375/260 |
| 2016/0380763 A1* | 12/2016 | Ahn | ..................... | H04W 12/02 380/270 |
| 2017/0012740 A1* | 1/2017 | Shen | .................. | H03M 13/6306 |
| 2017/0086220 A1* | 3/2017 | Kim | .................. | H04W 72/1289 |
| 2017/0264394 A1* | 9/2017 | Shen | .................. | H03M 13/27 |
| 2017/0338996 A1* | 11/2017 | Sankar | .................. | H04L 1/0058 |
| 2018/0026663 A1* | 1/2018 | Wu | .................... | H03M 13/6362 714/776 |
| 2018/0035427 A1* | 2/2018 | Gupta | ................... | H04L 1/1607 |
| 2018/0083736 A1* | 3/2018 | Manolakos | ....... | H03M 13/2707 |
| 2018/0152205 A1* | 5/2018 | Kim | .................. | H03M 13/2707 |
| 2018/0212628 A1* | 7/2018 | Chen | .................... | H04L 1/0058 |
| 2018/0255589 A1* | 9/2018 | Patil | .................. | H04W 74/0875 |
| 2018/0278272 A1* | 9/2018 | Li | .......................... | H03M 13/13 |
| 2018/0351697 A1* | 12/2018 | Kim | ....................... | H04W 28/04 |
| 2019/0103883 A1* | 4/2019 | Ye | .......................... | H04L 1/0042 |
| 2019/0190655 A1* | 6/2019 | Pan | ....................... | H04L 1/0072 |
| 2019/0253199 A1* | 8/2019 | Young | ....................... | H04L 1/1819 |
| 2019/0312679 A1* | 10/2019 | Jayasinghe | ........... | H04L 1/0038 |
| 2020/0007160 A1* | 1/2020 | Li | .......................... | H04L 1/0057 |
| 2020/0119845 A1* | 4/2020 | Chen | .................. | H03M 13/1102 |
| 2020/0228236 A1* | 7/2020 | Xi | ......................... | H04L 1/0045 |

FOREIGN PATENT DOCUMENTS

| | | |
|---|---|---|
| CN | 1433178 A | 7/2003 |
| CN | 101090305 A | 12/2007 |
| CN | 101119178 A | 2/2008 |
| CN | 101119182 A | 2/2008 |
| CN | 101325474 A | 12/2008 |
| CN | 101330351 A | 12/2008 |
| CN | 101442383 A | 5/2009 |
| CN | 101636938 A | 1/2010 |
| CN | 101911566 A | 12/2010 |
| CN | 102122966 A | 7/2011 |
| CN | 102835086 A | 12/2012 |
| CN | 102934383 A | 2/2013 |
| CN | 103023618 A | 4/2013 |
| CN | 103401571 A | 11/2013 |
| CN | 104067609 A | 9/2014 |
| CN | 105099622 A | 11/2015 |
| EP | 1748592 A2 | 1/2007 |
| EP | 2034649 A1 | 3/2009 |
| EP | 3113387 A1 | 1/2017 |
| EP | 3128782 A1 | 2/2017 |
| WO | 2015123842 A1 | 8/2015 |
| WO | 2016082142 A1 | 6/2016 |

OTHER PUBLICATIONS

International Search Report for PCT/CN2018/091889; dated Aug. 30, 2018 (Year: 2018).*
"Digital Video Broadcasting (DVB); Second generation framing structure, channel coding and modulation systems for Broadcasting, Interactive Services, News Gathering and other broadband satellite applications," ETSI EN 302 307 V1.1.2, XP014034070, pp. 1-74, Sophia Antipolis Cedex, France (Jun. 2006).
"Bit interleaver for LDPC codes," 3GPP TSG RAN WG1 Meeting NR#3, R1-1715501, Nagoya, Japan, total 11 pages, 3rd Generation Partnership Project, Valbonne, France (Sep. 18-21, 2017).
"Text proposal for SMP (Symbol Mapping based on bit Priority)," TSG-RAN WG1 #23, Tdoc R1-02-0024, Espoo, Finland, total 6 pages, (Jan. 8-11, 2002).
"Polar Codes Contruction and Rate Matching Scheme," 3GPP TSG RAN WG1 Meeting #89, R1-1707183, Hangzhou, China, total 14 pages, 3rd Generation Partnership Project, Valbonne, France (May 15-19, 2017).
"LDPC parity check bits interleaver," 3GPP TSG RAN WG1 NR Ad Hoc Meeting, R1-xxxxx, Nagoya, Japan, total 4 pages, 3rd Generation Partnership Project, Valbonne, France (Sep. 18-21, 2017).

(56) References Cited

OTHER PUBLICATIONS

"Enhanced HARQ Method with Signal Constellation Rearrangement," TSG-RAN Working Group 1 Meeting #19, TSGR1#19(01)0237, Las Vegas, USA, total 11 pages, (Feb. 27-Mar. 2, 2001).

"3rd Generation Partnership Project; Technical Specification Group Radio Access Network; Evolved Universal Terrestrial Radio Access (E-UTRA); Physical channels and modulation (Release 14)," 3GPP TS 36.211 V14.3.0, total 195 pages, 3rd Generation Partnership Project, Valbonne, France (Jun. 2017).

Jia et al., "Enhanced HARQ Employing LDPC Coded Constellation Rearrangement with 64QAM," IEEE, Proc. 2006 International Conference on Communication Technology, total 4 pages, Institute of Electrical and Electronics Engineers, New York, New York (Nov. 2006).

"LDPC Rate Matching," 3GPP TSG-RAN WG1 #89ah, R1-1711212, Qingdao, China, total 6 pages, 3rd Generation Partnership Project, Valbonne, France (Jun. 27-30, 2017).

"Rate Matching Schemes for Polar Codes," 3GPP TSG-RAN WG1 #89, R1-1707075, Hangzhou, P.R. China, total 6 pages, 3rd Generation Partnership Project, Valbonne, France (May 15-19, 2017).

"3rd Generation Partnership Project;Technical Specification Group Radio Access Network; NR; Multiplexing and channel coding(Release 15)," 3GPP TS 38.212 V1.0.0, total 28 pages, 3rd Generation Partnership Project, Valbonne, France (Sep. 2017).

"WF on LDPC parity check matrices," 3GPP TSG RAN WG1 NR AH #2, R1-1711982, Qingdao, China, Agenda item 5.1.4.1.2, total 2 pages, 3rd Generation Partnership Project, Valbonne, France (Jun. 27-30, 2017).

"3rd Generation Partnership Project; Technical Specification Group Radio Access Network; Evolved Universal Terrestrial Radio Access (E-UTRA); Multiplexing and channel coding (Release 14)," 3GPP TS 36.212 V14.3.0, total 198 pages, 3rd Generation Partnership Project, Valbonne, France (Jun. 2017).

"On design of bit-level interleaver," 3GPP TSG-RAN WG1 Meeting #AH NR, R1-1713710, Prague, Czech, total 6 pages, 3rd Generation Partnership Project, Valbonne, France (Aug. 21-25, 2017).

Mackay et al.,"Information Theory, Inference, and Learning Algorithms—Convergence of iterative decoding," Electronics Letters, vol. 35, No. 10, pp. 806-808 (May 13, 1999).

"Design of multiple family LDPC codes," 3GPP TSG-RAN WG1 #88, R1-1702642, Athens, Greece, total 10 pages, 3rd Generation Partnership Project, Valbonne, France (Feb. 13-17, 2017).

"Bit-level interieaverof LDPC codes on high order modulation," 3GPP TSG RAN WG1 #90, R1-1714589, Prague, Czechia, total 15 pages, 3rd Generation Partnership Project, Valbonne, France (Aug. 21-25, 2017).

Stierstorfer et al., "Optimizing BICM with convolutional codes for transmission over the AWGN channel," Int. Zurich Seminar on Communications (IZS), total 5 pages, (Mar. 3-5, 2010).

"Bit Priority Mapping for LTE Shared TrCH Processing Chain," 3GPP TSG-RAN Working Group 1 #49,Tdoc R1-072270, Kobe, Japan, total 2 pages, 3rd Generation Partnership Project, Valbonne, France (May 7-11, 2007).

"Performance evaluation of LDPC codes for NR eMBB data," 3GPP TSG RAN WG1 Meeting #90, R1-1713740, Prague, Czech Republic, total 13 pages, 3rd Generation Partnership Project, Valbonne, France (Aug. 21-25, 2017).

"LDPC design for eMBB data," 3GPP TSG RAN WG1 NR Ad-Hoc Meeting, R1-1700092, Spokane, USA, total 17 pages, 3rd Generation Partnership Project, Valbonne, France (Jan. 16-20, 2017).

"3rd Generation Partnership Project; Technical Specification Group Radio Access Network; NR; Physical channels and modulation(Release 15)," 3GPP TS 38.211 V1.0.0, total 37 pages, 3rd Generation Partnership Project, Valbonne, France (Sep. 2017).

"LDPC design for eMBB data," 3GPP TSG RAN WG1 Meeting #88, R1-1701706, Athens, Greece, total 7 pages, 3rd Generation Partnership Project, Valbonne, France (Feb. 13-17, 2017).

Xie Qiuliang et al., "Bit-interleaved LDPC coded modulation with iterative demapping and decoding," Total 4 pages (2019) With English abstract.

Safavi et al., "Ultra Low Density Spread Transmission," IEEE Communications Letters, vol. 20, No. 7, XP011616351, pp. 1373-1376, Institute of Electrical and Electronics Engineers, New York, New York (Jul. 2016).

Zaidi et al., "Ericsson Technology 5G New Radio: Designing For the Future," 5G NR Physical Layer Design 2, Ericsson Technology Review, Ericsson Technology Review Articles, XP055780903, total 14 pages, Ericsson, Stockholm, Sweden (Jul. 24, 2017).

Xie Qiuliang et al., "Bit-interleaved LDPC coded modulation with iterative demapping and decoding," Total 4 pages With English abstract. 2009.

Lei et al., "Demultiplexer Design for Multi-Edge Type LDPC Coded Modulation," ISIT 2009, Seoul, Korea, Total 5 pages (Jun. 28-Jul. 3, 2009).

* cited by examiner

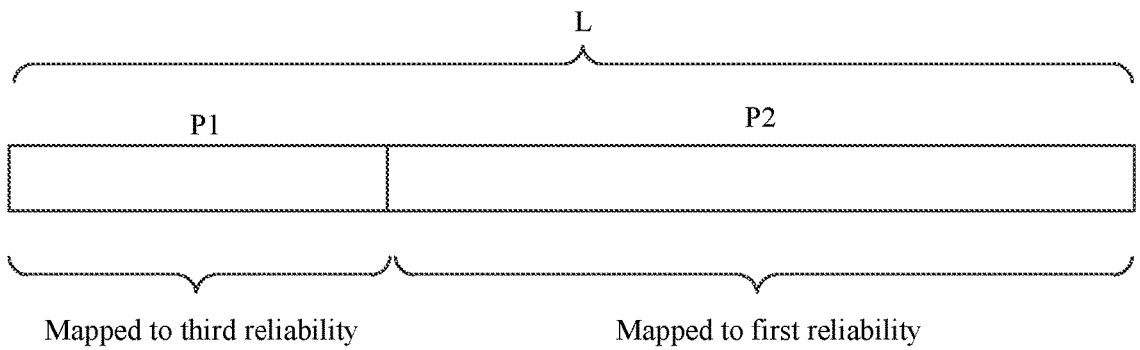
FIG. 11M
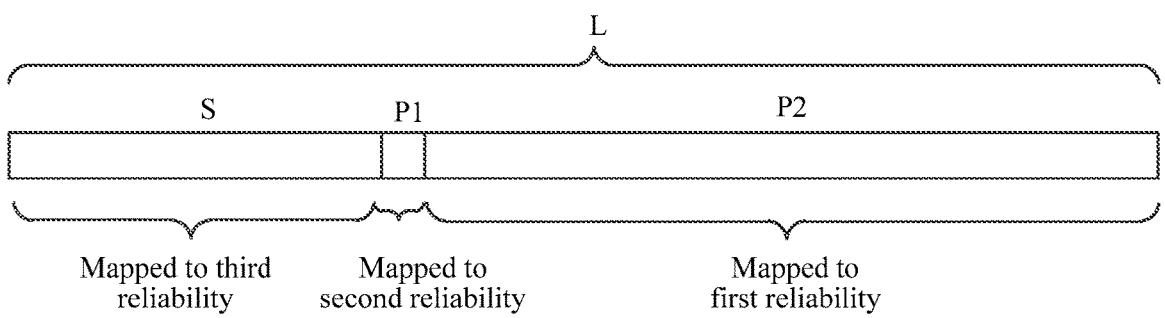
FIG. 11N
| L to-be-sent bits | $b_0$ | $b_1$ | $b_2$ | $b_3$ | $b_4$ | $b_5$ | $b_6$ | $b_7$ | $b_8$ | $b_9$ | $b_{10}$ | $b_{11}$ |
|---|---|---|---|---|---|---|---|---|---|---|---|---|
| Mapping | ↓ | ↓ | ↓ | ↓ | ↓ | ↓ | ↓ | ↓ | ↓ | ↓ | ↓ | ↓ |
| Bit location | $I_0(0)$ | $Q_0(0)$ | $I_0(1)$ | $Q_0(1)$ | $I_1(0)$ | $Q_1(0)$ | $I_1(1)$ | $Q_1(1)$ | $I_2(0)$ | $Q_2(0)$ | $I_2(1)$ | $Q_2(1)$ |
FIG. 12A

| L to-be-sent bits | $b_0$ | $b_1$ | $b_2$ | $b_3$ | $b_4$ | $b_5$ | $b_6$ | $b_7$ | $b_8$ | $b_9$ | $b_{10}$ | $b_{11}$ |
|---|---|---|---|---|---|---|---|---|---|---|---|---|
| Mapping | ↓ | ↓ | ↓ | ↓ | ↓ | ↓ | ↓ | ↓ | ↓ | ↓ | ↓ | ↓ |
| Bit location | $I_0(0)$ | $I_0(1)$ | $Q_0(0)$ | $Q_0(1)$ | $I_1(0)$ | $I_1(1)$ | $Q_1(0)$ | $Q_1(1)$ | $I_2(0)$ | $I_2(1)$ | $Q_2(0)$ | $Q_2(1)$ |

FIG. 12B

| | | | | | | | | | | | | | | | | | | | | | | | | | |
|---|---|---|---|---|---|---|---|---|---|---|---|---|---|---|---|---|---|---|---|---|---|---|---|---|---|
| Previous time of transmission | L to-be-sent bits | $b_0$ | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $b_{15}$ | $b_{16}$ | $b_{17}$ | $b_{18}$ | $b_{19}$ | $b_{20}$ | $b_{21}$ | $b_{22}$ | $b_{23}$ |
| | Mapping | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ |
| | Bit location | $I_0(0)$ | $I_0(1)$ | $I_0(2)$ | $I_0(3)$ | $Q_0(0)$ | $Q_0(1)$ | $Q_0(2)$ | $Q_0(3)$ | $I_1(0)$ | $I_1(1)$ | $I_1(2)$ | $I_1(3)$ | $Q_1(0)$ | $Q_1(1)$ | $Q_1(2)$ | $Q_1(3)$ | $I_2(0)$ | $I_2(1)$ | $I_2(2)$ | $I_2(3)$ | $Q_2(0)$ | $Q_2(1)$ | $Q_2(2)$ | $Q_2(3)$ |
| Next time of transmission | L to-be-sent bits | $b_0$ | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $b_{15}$ | $b_{16}$ | $b_{17}$ | $b_{18}$ | $b_{19}$ | $b_{20}$ | $b_{21}$ | $b_{22}$ | $b_{23}$ |
| | Mapping | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ |
| | Bit location | $I_0(0)$ | $I_0(1)$ | $I_0(2)$ | $I_0(3)$ | $Q_0(0)$ | $Q_0(1)$ | $Q_0(2)$ | $Q_0(3)$ | $I_2(0)$ | $I_2(1)$ | $I_2(2)$ | $I_2(3)$ | $Q_2(0)$ | $Q_2(1)$ | $Q_2(2)$ | $Q_2(3)$ | $I_1(0)$ | $I_1(1)$ | $I_1(2)$ | $I_1(3)$ | $Q_1(0)$ | $Q_1(1)$ | $Q_1(2)$ | $Q_1(3)$ |

FIG. 13A

| | | | | | | | | | | | | | | | | | | | | | | | | | |
|---|---|---|---|---|---|---|---|---|---|---|---|---|---|---|---|---|---|---|---|---|---|---|---|---|---|
| Previous time of transmission | L to-be-sent bits | $b_0$ | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $b_{15}$ | $b_{16}$ | $b_{17}$ | $b_{18}$ | $b_{19}$ | $b_{20}$ | $b_{21}$ | $b_{22}$ | $b_{23}$ |
| | Mapping | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ |
| | Bit location | $I_0(0)$ | $I_0(1)$ | $I_0(2)$ | $I_0(3)$ | $Q_0(0)$ | $Q_0(1)$ | $Q_0(2)$ | $Q_0(3)$ | $I_1(0)$ | $I_1(1)$ | $I_1(2)$ | $I_1(3)$ | $Q_1(0)$ | $Q_1(1)$ | $Q_1(2)$ | $Q_1(3)$ | $I_2(0)$ | $I_2(1)$ | $I_2(2)$ | $I_2(3)$ | $Q_2(0)$ | $Q_2(1)$ | $Q_2(2)$ | $Q_2(3)$ |
| Next time of transmission | L to-be-sent bits | $b_0$ | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $b_{15}$ | $b_{16}$ | $b_{17}$ | $b_{18}$ | $b_{19}$ | $b_{20}$ | $b_{21}$ | $b_{22}$ | $b_{23}$ |
| | Mapping | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ | ↓ |
| | Bit location | $I_1(0)$ | $I_1(1)$ | $I_1(2)$ | $I_1(3)$ | $Q_1(0)$ | $Q_1(1)$ | $Q_1(2)$ | $Q_1(3)$ | $I_2(0)$ | $I_2(1)$ | $I_2(2)$ | $I_2(3)$ | $Q_2(0)$ | $Q_2(1)$ | $Q_2(2)$ | $Q_2(3)$ | $I_0(0)$ | $I_0(1)$ | $I_0(2)$ | $I_0(3)$ | $Q_0(0)$ | $Q_0(1)$ | $Q_0(2)$ | $Q_0(3)$ |

FIG. 13B

| $C_0$ | $C_1$ | $C_2$ | $C_3$ |
|---|---|---|---|
| $C_4$ | $C_5$ | $C_6$ | $C_7$ |
| $C_8$ | $C_9$ | $C_{10}$ | $C_{11}$ |
| $C_{12}$ | $C_{13}$ | $C_{14}$ | $C_{15}$ |

FIG. 14

| Modulation symbol before interleaving | $C_0$ | $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $C_{15}$ |
|---|---|---|---|---|---|---|---|---|---|---|---|---|---|---|---|---|
| Modulation symbol after interleaving | $C_0$ | $C_4$ | $C_8$ | $C_{12}$ | $C_1$ | $C_5$ | $C_9$ | $C_{13}$ | $C_2$ | $C_6$ | $C_{10}$ | $C_{14}$ | $C_3$ | $C_7$ | $C_{11}$ | $C_{15}$ |

FIG. 15

| $C_0$ | $C_1$ | $C_2$ | $C_3$ |
|---|---|---|---|
| $C'_0$ | $C'_1$ | $C'_2$ | $C'_3$ |
| $C_4$ | $C_5$ | $C_6$ | $C_7$ |
| $C'_4$ | $C'_5$ | $C'_6$ | $C'_7$ |

FIG. 16

| First group of modulation symbols before interleaving | $C_0$ | $C_1$ | $C_2$ | $C_3$ | $C_4$ | $C_5$ | $C_6$ | $C_7$ | | | | | | | | |
|---|---|---|---|---|---|---|---|---|---|---|---|---|---|---|---|---|
| Second group of modulation symbols before interleaving | $C'_0$ | $C'_1$ | $C'_2$ | $C'_3$ | $C'_4$ | $C'_5$ | $C'_6$ | $C'_7$ | | | | | | | | |
| Modulation symbol after interleaving | $C_0$ | $C'_0$ | $C_4$ | $C'_4$ | $C_1$ | $C'_1$ | $C_5$ | $C'_5$ | $C_2$ | $C'_2$ | $C_6$ | $C'_6$ | $C_3$ | $C'_3$ | $C_7$ | $C'_7$ |

FIG. 17

| | | | |
|---|---|---|---|
| $C_0$ | $C_1$ | $C_2$ | $C_3$ |
| $C_4$ | $C_5$ | $C_6$ | $C_7$ |
| $C_8$ | $C_9$ | $C_{10}$ | $C_{11}$ |
| $C_{12}$ | $C_{13}$ | Empty | Empty |

FIG. 18

WIRELESS COMMUNICATION DATA PROCESSING METHOD AND APPARATUS FOR REDUCING BIT ERROR RATE

CROSS-REFERENCE TO RELATED APPLICATIONS

This application is a continuation of International Application No. PCT/CN2018/091889, filed on Jun. 19, 2018, which claims priority to Chinese Patent Application No. 201710459416.3, filed on Jun. 16, 2017, Chinese Patent Application No. 201710459780.X, filed on Jun. 17, 2017, and International Application No. PCT/EP2017/072643, filed on Sep. 8, 2017. The disclosures of the aforementioned applications are hereby incorporated by reference in their entireties.

TECHNICAL FIELD

The present invention relates to the field of data communications technologies, and in particular, to a data processing method and a data processing apparatus.

BACKGROUND

With an increase in a communication data volume and a continuous change in service types, a future wireless communications system needs to have better transmission performance than that of a currently used wireless communications system such as a cellular system or a long term evolution (LTE) system. For example, the future wireless communications system requires a lower delay, a lower bit error rate, and the like. However, when considered in connection with characteristics of a radio channel such as a multipath characteristic, a time-varying characteristic, and a fading characteristic, the foregoing objective can be achieved only after a sufficiently reliable and effective transmission technology is proposed.

In the prior art, during data transmission, a transmit end first encodes a to-be-sent data block, to obtain an initial bit sequence, that is, an encoded code word; then determines, based on a hybrid automatic repeat request (HARQ) technology, to-be-sent bits corresponding to initial transmission (that is, the first time of transmission) and retransmission (which includes the second time of transmission, the third time of transmission, the fourth time of transmission, and the like); maps to-be-sent bits during each time of transmission to a modulation symbol by using a higher order modulation scheme, as shown in FIG. 1; and sends a modulation symbol generated after mapping to a receive end.

Within a modulation symbol of a higher order modulation technology, a plurality of bit locations have a reliability difference between each other. When data transmission is performed by using the HARQ technology, merging of retransmission packets increases the reliability difference between the bit locations within the modulation symbol. As a result, a bit error rate is increased. After the bit error rate is increased, because the receive end of the wireless communications system cannot correctly perform decoding, a plurality of times of retransmission are required, increasing a delay. It can be learned that, the transmission solution in the prior art causes an adverse effect on transmission performance of the wireless communications system. How to improve the transmission performance of the wireless communications system is a current technical problem to be resolved urgently.

SUMMARY

Embodiments of the present invention provide a data processing method and a data processing apparatus, to reduce a bit error rate of a wireless communications system and improve transmission performance of the wireless communications system.

According to a first aspect, a bit mapping method is provided. The method is applied to a wireless communications system. In the method, a transmit end in the wireless communications system first determines an information bit field and a first parity bit field, or an information bit field, a first parity bit field, and a second parity bit field based on an encoding matrix and a to-be-sent data block; and then determines L to-be-sent bits in the plurality of bit fields, where the L to-be-sent bits include at least one bit field, the at least one bit field is at least one of the information bit field and the first parity bit field or the at least one bit field is at least one of the information bit field, the first parity bit field, and the second parity bit field, and the at least one bit field has at least one prioritization manner. Finally, the transmit end maps, based on a rule that a bit in a bit field having a high priority is preferentially mapped to a bit location that is of at least one modulation symbol and that has a high reliability level, the L to-be-sent bits to L bit locations included in the at least one modulation symbol, and outputs the at least one modulation symbol, where the information bit field is a bit sequence the same as a to-be-sent data block or a bit sequence obtained by performing weighted-type transform processing on a to-be-sent data block, the first parity bit field is a bit field obtained by encoding the to-be-sent data block by using a first part of an encoding matrix, and the second parity bit field is a bit field obtained by encoding the to-be-sent data block by using a second part of the encoding matrix.

Through the foregoing method, during data transmission, the transmit end obtains, through the to-be-sent data block and the encoding matrix, the at least one bit field included in the L to-be-sent bits, and allocates a priority to each bit field, for example, allocates a relatively high priority to an important bit field. In this way, when the L to-be-sent bits are mapped, the important bit field in the L to-be-sent bits is mapped to a bit location that is of the at least one modulation symbol and that has a high reliability level, to increase reliability of the important bit field in a transmission process, thereby reducing a bit error rate of the wireless communications system and improving transmission performance of the wireless communications system.

In an example design, when determining to allocate a priority to the at least one bit field included in the L to-be-sent bits, the transmit end may use one of the following plurality of preset prioritization manners. The plurality of preset prioritization manners include:

a priority of the information bit field is a first priority, a priority of the parity bit field is a second priority, the first priority is higher than the second priority, and the parity bit field includes the first parity bit field and/or the second parity bit field;

a priority of the information bit field is a first priority, a priority of the first parity bit field is a second priority, a priority of the second parity bit field is a third priority, the first priority is higher than the second priority, and the second priority is higher than the third priority;

a priority of the information bit field is a first priority, a priority of the second parity bit field is a second priority, a priority of the first parity bit field is a third priority, the first priority is higher than the second priority, and the second priority is higher than the third priority;

a priority of the parity bit field is a first priority, a priority of the information bit field is a second priority, the first priority is higher than the second priority, and the parity bit field includes the first parity bit field and/or the second parity bit field;

a priority of the first parity bit field is a first priority, a priority of the second parity bit field is a second priority, a priority of the information bit field is a third priority, the first priority is higher than the second priority, and the second priority is higher than the third priority;

a priority of the second parity bit field is a first priority, a priority of the information bit field is a second priority, a priority of the first parity bit field is a third priority, the first priority is higher than the second priority, and the second priority is higher than the third priority;

a priority of the first parity bit field is a first priority, a priority of the information bit field is a second priority, a priority of the second parity bit field is a third priority, the first priority is higher than the second priority, and the second priority is higher than the third priority;

a priority of the first parity bit field is a first priority, a priority of the second parity bit field is a second priority, and the first priority is higher than the second priority;

a priority of the second parity bit field is a first priority, a priority of the first parity bit field is a second priority, and the first priority is higher than the second priority; or a priority of the second parity bit field is a first priority, a priority of the first parity bit field is a second priority, a priority of the information bit field is a third priority, the first priority is higher than the second priority, and the second priority is higher than the third priority.

Through the foregoing method, the transmit end may select different prioritization manners based on different use situations to allocate a priority to the at least one bit field included in the L to-be-sent bits, thereby flexibly adjusting a priority of each bit field.

In an example design, if the L to-be-sent bits are bits that need to be sent when the to-be-sent data block is retransmitted, when allocating a priority to the at least one bit field included in the L to-be-sent bits, the transmit end uses a prioritization manner different from a prioritization manner used when the to-be-sent data block is initially transmitted, or uses a prioritization manner different from a prioritization manner used when the to-be-sent data block is transmitted last time.

Through the foregoing method, when initially transmitting or retransmitting the to-be-sent data block, the transmit end may allocate different priorities to a same bit field, thereby improving transmission performance of each of the at least one bit field corresponding to the to-be-sent data block.

In an example design, when mapping the L to-be-sent bits to the L bit locations included in the at least one modulation symbol, the transmit end first sorts the L to-be-sent bits in descending priority order, and then maps the sorted L to-be-sent bits to the L bit locations of the at least one modulation symbol.

Through the foregoing method, the transmit end may preferentially map, based on a priority order of bit fields, a bit that is of the L to-be-sent bits and that has a high priority to the L bit locations, thereby enabling a bit field having a higher priority to preferentially obtain better transmission performance.

In an example design, after outputting the at least one modulation symbol, the transmit end interleaves the at least one modulation symbol in a block interleaving manner, to generate at least one interleaved modulation symbol, where a parameter of a row quantity and a column quantity of an interleaving matrix used in the block interleaving manner is determined based on a length of a time scheduling unit and/or a symbol quantity of the at least one modulation symbol.

Through the foregoing method, the transmit end may obtain a higher diversity gain through interleaving, thereby enabling the wireless communications system to obtain better transmission performance.

According to a second aspect, an embodiment of the present invention further provides a data processing apparatus. The data processing apparatus has a function of implementing behavior of the transmit end in the foregoing method example according to the first aspect. The function may be implemented by using hardware, or may be implemented by hardware executing corresponding software. The hardware or the software includes one or more modules corresponding to the foregoing function.

In an example design, a structure of the data processing apparatus includes a bit mapping unit and an output unit, and these units may perform corresponding functions in the foregoing method example. For details, refer to the detailed description in the method example. Details are not repeated herein.

According to a third aspect, an embodiment of the present invention further provides a data processing method. The method is applied to a wireless communications system and includes:

mapping L to-be-sent bits to L bit locations included in L/Om modulation symbols, where the L to-be-sent bits include an information bit field and a parity bit field, where each of the modulation symbols corresponds to Om bit locations, and in a retransmission process, a bit in the parity bit field is preferentially mapped to a bit location of the L bit locations that has high reliability; and outputting the modulation symbols.

A transmit end such as a terminal device or a network device in the wireless communications system selects an encoding matrix to encode a to-be-sent data block to obtain an initial bit sequence, and separately determines the L to-be-sent bits in the initial bit sequence in an initial transmission process or a retransmission process.

The L to-be-sent bits may include an information bit field and a parity bit field.

In the initial transmission process and the retransmission process, locations at which the L to-be-sent bits are obtained from the initial bit sequence may be the same or different.

In an example design, in the L to-be-sent bits, the information bit field precedes the parity bit field, or the parity bit field is arranged preceding the information bit field. For example, in the initial transmission process, the L to-be-sent bits may be obtained from a location corresponding to RV0, and the information bit field precedes the parity bit field. For another example, in the retransmission process, the L to-be-sent bits may be obtained from a location corresponding to RV2, and the parity bit field precedes the information bit field.

In an example design, the L to-be-sent bits may be rearranged through a row-column interleaver; and the rearranged bits are mapped to the L bit locations.

A row quantity of the row-column interleaver is a modulation order or a column quantity of the row-column interleaver is a modulation order.

If a modulation scheme of the modulation symbols is 16QAM, the modulation order is 4, and each modulation symbol corresponds to four bit locations. Reliability of two of four bit locations of each modulation symbol is higher than reliability of two remaining bit locations. To be specific, the L bit locations have two reliability levels.

If a modulation scheme of the modulation symbols is 64QAM, the modulation order is 6, and each modulation symbol corresponds to six bit locations. Every two of six bit locations of each modulation symbol correspond to one reliability level, and there are three reliability levels in total. To be specific, the L bit locations have three reliability levels.

If a modulation scheme of the modulation symbols is 256QAM, the modulation order is 8, and each modulation symbol corresponds to eight bit locations. Every two of eight bit locations of each modulation symbol correspond to one reliability level, and there are four reliability levels in total. To be specific, the L bit locations have four reliability levels.

In an example design, a reliability level corresponding to a location to which a bit in the information bit field is mapped is higher than a reliability level corresponding to a location to which a bit in the parity bit field is mapped.

That a reliability level corresponding to a location to which a bit in the information bit field is mapped is higher than or equal to a reliability level corresponding to a location to which a bit in the parity bit field is mapped may be that the bit in the information bit field is preferentially mapped to a location having high reliability.

According to a fourth aspect, an embodiment of the present invention further provides a data processing method. The method is applied to a wireless communications system and includes:

mapping L to-be-sent bits to L bit locations included in L/Om modulation symbols, where the L to-be-sent bits include an information bit field and a parity bit field, where each of the modulation symbols corresponds to Om bit locations, and in a retransmission process, in Om bit locations corresponding to each modulation symbol to which the information bit field and the parity bit field are mapped, a bit in the parity bit field is preferentially mapped to a location preceding a location to which a bit in the information bit field is mapped; and outputting the modulation symbols.

In the Om bit locations corresponding to the modulation symbol, $I_0$ and $Q_0$ have a highest reliability level, and $I_{Lm-1}$ and $Q_{Lm-1}$ have a lowest reliability level.

A transmit end such as a terminal device or a network device in the wireless communications system selects an encoding matrix to encode a to-be-sent data block to obtain an initial bit sequence, and separately determines the L to-be-sent bits in the initial bit sequence in an initial transmission process or a retransmission process.

The L to-be-sent bits may include an information bit field and a parity bit field.

Om bit locations of each of the modulation symbols to which the information bit field and the parity bit field are mapped include bits in the information bit field and bits in the parity bit field.

In the initial transmission process and the retransmission process, locations at which the L to-be-sent bits are obtained from the initial bit sequence may be the same or different.

In an example design, in the L to-be-sent bits, the information bit field precedes the parity bit field, or the parity bit field is arranged preceding the information bit field. For example, in the initial transmission process, the L to-be-sent bits may be obtained from a location corresponding to RV0, and the information bit field precedes the parity bit field. For another example, in the retransmission process, the L to-be-sent bits may be obtained from a location corresponding to RV2, and the parity bit field precedes the information bit field.

In an example design, in an initial transmission process, in Om bit locations corresponding to each modulation symbol to which the information bit field and the parity bit field are mapped, a bit in the information bit field is preferentially mapped to a location preceding a location to which a bit in the parity bit field is mapped.

According to a fifth aspect, an embodiment of the present invention further provides a data processing apparatus. The data processing apparatus has a function of implementing behavior of the transmit end in the foregoing method example according to the third aspect or the fourth aspect. The function may be implemented by using hardware, or may be implemented by hardware executing corresponding software. The hardware or the software includes one or more modules corresponding to the foregoing function.

In an example design, a structure of the data processing apparatus includes a bit mapping unit and an output unit, and these units may perform corresponding functions in the foregoing method example. For details, refer to the detailed description in the method example. Details are not repeated herein.

According to a sixth aspect, an embodiment of the present invention further provides a data processing apparatus. The data processing apparatus has a function of implementing the data processing method in the foregoing method example. The function may be implemented by using hardware. A structure of the data processing apparatus includes a processor and a memory coupled to the processor, where the processor is configured to perform the foregoing data processing methods.

According to a seventh aspect, an embodiment of the present invention further provides a data processing apparatus. The data processing apparatus has a function of implementing the data processing method in the foregoing method example. The function may be implemented by using hardware. A structure of the data processing apparatus includes a memory, a processor, and an instruction that is stored in the memory and that can be run on the processor, where when the processor runs the instruction, the data processing apparatus is enabled to implement the method according to the first aspect, the third aspect, or the fourth aspect.

According to an eighth aspect, an embodiment of the present invention further provides a computer storage medium. The computer storage medium is configured to store a computer software instruction used by the data processing apparatus according to the second aspect or the fifth aspect or the data processing apparatus according to the third aspect or the sixth aspect, and includes a program that is designed for the data processing apparatus and that is configured to perform any possible design of the first aspect, the third aspect, or the fourth aspect.

According to a ninth aspect, an embodiment of the present invention further provides a computer program product. The computer program product includes an instruction, and when the instruction is run on a computer, the computer is enabled to perform any method according to the first aspect, the third aspect, or the fourth aspect.

BRIEF DESCRIPTION OF DRAWINGS

FIG. 12A and FIG. 12B are schematic diagrams of mapping, by a network device, L to-be-sent bits to L bit locations of at least one modulation symbol according to an embodiment of the present invention;

FIG. 13A and FIG. 13B are schematic diagrams of mapping, by a network device, L to-be-sent bits to L bit locations of at least one modulation symbol during retransmission of a to-be-sent data block according to an embodiment of the present invention;

FIG. 14 is a schematic diagram of an interleaving matrix obtained by a network device based on LC modulation symbols according to an embodiment of the present invention;

FIG. 15 is a schematic diagram of an interleaved modulation symbol obtained by a network device based on the interleaving matrix shown in FIG. 14 according to an embodiment of the present invention;

FIG. 16 is a schematic diagram of an interleaving matrix obtained by a network device based on two groups of modulation symbols according to an embodiment of the present invention;

FIG. 17 is a schematic diagram of an interleaved modulation symbol obtained by a network device based on the interleaving matrix shown in FIG. 16 according to an embodiment of the present invention;

FIG. 18 is a schematic diagram of an interleaving matrix obtained by a network device based on modulation symbols when a quantity of modulation symbols cannot form a complete interleaving matrix according to an embodiment of the present invention.

DESCRIPTION OF EMBODIMENTS

Figure 1:
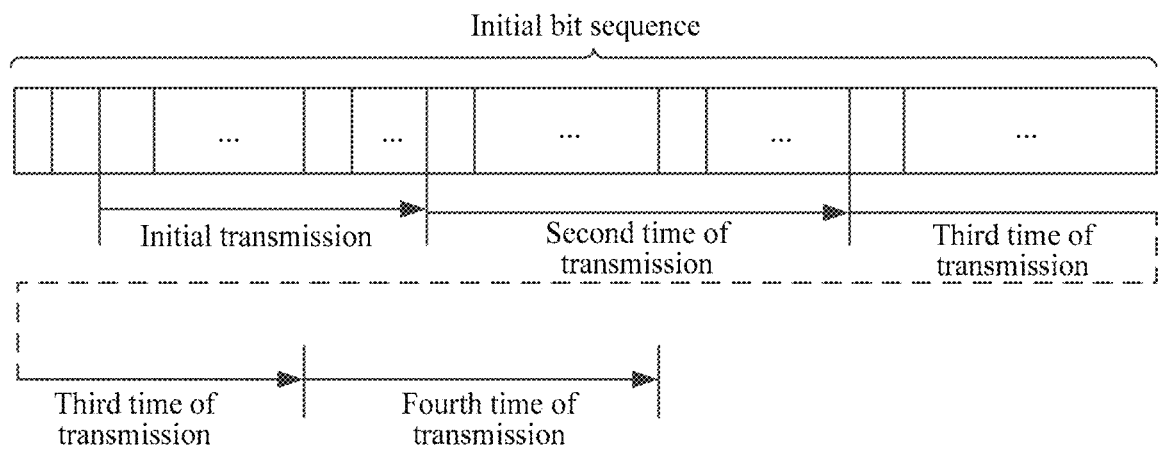
FIG. 1 is a schematic diagram of to-be-sent bits transmitted each time data transmission is performed by using a HARQ technology in the prior art.

Embodiments of the present invention provide a data processing method and a data processing apparatus, to reduce a bit error rate of a wireless communications system and improve transmission performance of the wireless communications system.

The data processing method provided in the embodiments of the present invention may be applied to various wireless communications systems such as a new radio (NR) system, Wireless Fidelity (Wi-Fi), worldwide interoperability for microwave access (WiMAX), a global system for mobile communications (GSM) system, a code division multiple access (CDMA) system, a wideband code division multiple access (WCDMA) system, a general packet radio service (GPRS), an LTE system, a long term evolution-advanced (LTE-A) system, a universal mobile telecommunications system (UMTS), a cellular system related to the 3rd Generation Partnership Project (3GPP), and a fifth generation mobile communications system (5G).

In the following, some terms of the embodiments of the present invention are described, to help a person skilled in the art have a better understanding.

A network device, for example, including a base station (for example, an access point), may be a device that communicates with a wireless terminal device over an air interface by using one or more sectors in an access network. The base station may be configured to perform mutual conversion between a received over-the-air frame and an IP packet, to serve as a router between the terminal device and a remaining part of the access network, where the remaining part of the access network may include an IP network. The base station may further coordinate attribute management of the air interface. For example, the base station may include an evolved NodeB (NodeB or eNB or e-NodeB, evolutional NodeB) in a long term evolution (LTE) system or an LTE-advanced (LTE-A) system, or may include a next generation NodeB (next generation NodeB or gNB) in a 5G system. This is not limited in the embodiments of the present invention.

A terminal device includes a device providing voice and/or data connectivity to a user, and may include, for example, a handheld device having a wireless connection function or a processing device connected to a wireless modem. The terminal device may communicate with a core network through a radio access network (RAN), and exchange a voice and/or data with the RAN. The terminal device may include user equipment (UE), a wireless terminal device, a mobile terminal device, a subscriber unit, a subscriber station, a mobile station, a mobile console, a remote station, an access point (AP), a remote terminal device, an access terminal device, a user terminal device, a user agent, a user device, or the like. For example, the terminal device may include a mobile phone (or referred to as a "cellular" phone), a computer having a mobile terminal device, a portable, pocket-sized, handheld, computer built-in, or in-vehicle mobile apparatus, a smart wearable device, or the like. For example, the terminal device may be a device such as a personal communication service (PCS) telephone, a cordless telephone, a session initiation protocol (SIP) telephone, a wireless local loop (WLL) station, a personal digital assistant (PDA), a smart watch, a smart helmet, smart glasses, or a smart band. The terminal device further includes a limited device such as a device having relatively low power consumption, a device having a limited storage capability, or a device having a limited computing capability. For example, the terminal device includes an information sensing device such as a barcode, radio frequency identification (RFID), a sensor, a global positioning system (GPS), or a laser scanner.

A time scheduling unit is a time domain resource formed by a time unit such as at least one slot, at least one subframe, at least one mini-slot, or at least one mini-subframe, or a unit formed by aggregating a plurality of slots, a plurality of subframes, a plurality of mini-slots, or a plurality of mini-subframes.

A reliability level is used to indicate a probability that transmission succeeds at a bit location in at least one modulation symbol or a bit location in at least one modulation symbol has a bit error during transmission of the at least one modulation symbol. A bit location having a high reliability level indicates a high probability that transmission succeeds at the bit location or a low probability that the bit location has a bit error.

A redundancy version (RV) is used to indicate a location of an initial bit sequence from which a bit in the initial bit sequence is obtained, where the RV has a plurality of values.

A priority is used to indicate importance of a bit field in an initial bit sequence.

A bit sequence is a sequence comprising bits "0" and/or "1". A length of the bit sequence is a quantity of bits included in the bit sequence. For example, a bit sequence 00 includes two bits, and has a length of 2; a bit sequence 111 includes three bits, and has a length of 3; and a bit sequence "0100" includes four bits, and has a length of 4.

Both a transport block (TB) and a code block (CB) may be considered as a bit sequence. A code block is obtained after a transport block or a transport block obtained through processing is divided, and is an object of encoding. Therefore, in this application, a length of a code block is a quantity of bits included in a bit sequence corresponding to the code block, and the length of the code block may also be referred to as a size of the code block. A length of a transport block is a quantity of bits included in a bit sequence corresponding to the transport block, and the length of the transport block may also be referred to as a size of the transport block. It may be understood that with development of technologies, the transport block or the code block may have different terms. In the embodiments of this application, a transport block obtained through processing may also be understood as a transport block, and the processing may be adding parity bits, for example, attaching cyclic redundancy check (CRC) bits based on an initial transport block. This is not limited in the embodiments of this application.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects, unless otherwise indicated.

Unless otherwise stated, ordinal numerals such as "first", "second", "third", and "fourth" mentioned in the embodiments of this application are used to differentiate between a plurality of objects, but not used to limit an order, a time sequence, priorities, or importance degrees of the plurality of objects.

Application scenarios of embodiments of the present invention are briefly described below.

Figure 2:
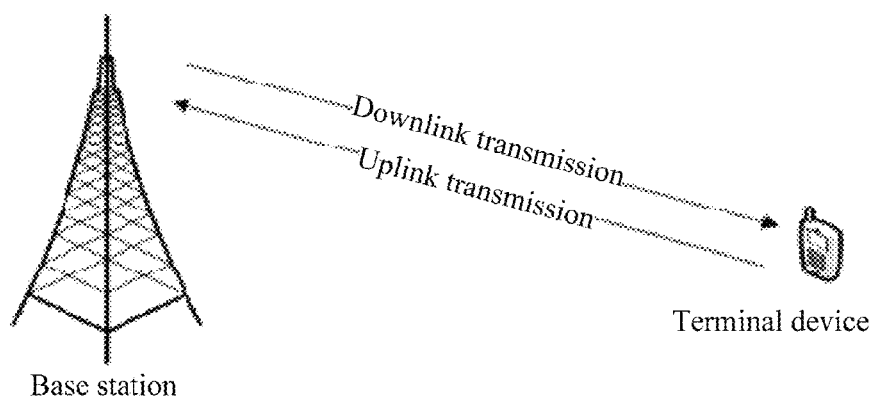
FIG. 2 is a schematic diagram of an example network architecture according to an embodiment of the present invention.

FIG. 2 is a schematic diagram of an example network architecture according to an embodiment of the present invention. A wireless communications system in FIG. 2 may include a terminal device and a base station. The base station is configured to provide a communication service to the terminal device and access a core network, and the terminal accesses the network by searching for a synchronization signal, a broadcast signal, or the like sent by the base station.

It should be noted that, in a scenario shown in FIG. 2, description is made by using interaction between only one base station and one terminal device as an example, and the application scenario of this application should not be limited by the example. An actual network architecture may include a plurality of base stations and a plurality of terminals. For example, one terminal device may perform data transmission with only one base station, or may perform data transmission with a plurality of base stations. One base station may perform data transmission with one terminal device, or may perform data transmission with a plurality of terminal devices. This is not specifically limited in this application.

Figure 3:
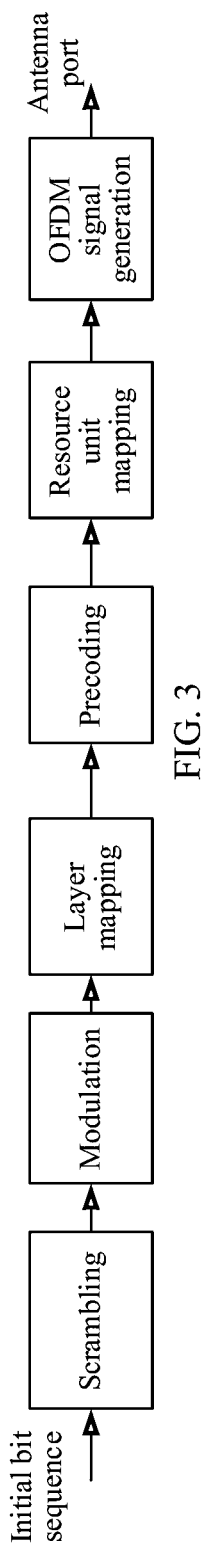
FIG. 3 is a schematic diagram of encoding and modulating, by a transmit end, a to-be-sent data block in the prior art.

In the wireless communications system, when a transmit end sends data to a receive end, for example, the terminal device needs to send uplink data to a network device, or a network device sends downlink data to the terminal device, a process of processing, by the transmit end, a to-be-sent data block is shown in FIG. 3. In FIG. 3, the transmit end first encodes a to-be-sent data block, to obtain an initial bit sequence, then maps the initial bit sequence to at least one modulation symbol, to generate a complex-valued modulation symbol, and performs layer mapping, precoding processing, and the like on the complex-valued modulation symbol, so that the complex-valued modulation symbol can be suitable for transmission on an antenna port; and finally maps a complex-valued modulation symbol of each antenna port to a resource unit, generates an OFDM signal, and sends the OFDM signal to the receive end through a physical antenna.

During processing shown in FIG. 3, encoding and modulation processing on data are main factors affecting transmission performance of the wireless communications system. To improve the transmission performance of the wireless communications system, when data is encoded, an advanced encoding technology may be used. For example, a low-density parity-check code (LDPC) encoding scheme, a reed-muller codes (RM) encoding scheme, or a polar (Polar) code encoding scheme is used, and related encoding technologies have been relatively mature. Therefore, the embodiments of the present invention optimize modulation processing.

A modulation scheme used in the prior art is described below, and the modulation scheme is as follows:

After a start location of to-be-sent bits in an initial bit sequence is determined, each of the to-be-sent bits is sequentially mapped to at least one modulation symbol based on an order of the to-be-sent bits in the initial bit sequence. For example, the to-be-sent bits are "011011011001", modulation is performed by using a 16QAM modulation scheme, and each modulation symbol corresponds to four bits in the 16QAM modulation scheme. Therefore, every four bits are mapped to one modulation symbol based on an order of all of the to-be-sent bits, thereby obtaining three modulation symbols being respectively "0110", "1101", and "1001", to complete a modulation process.

Figure 4A:
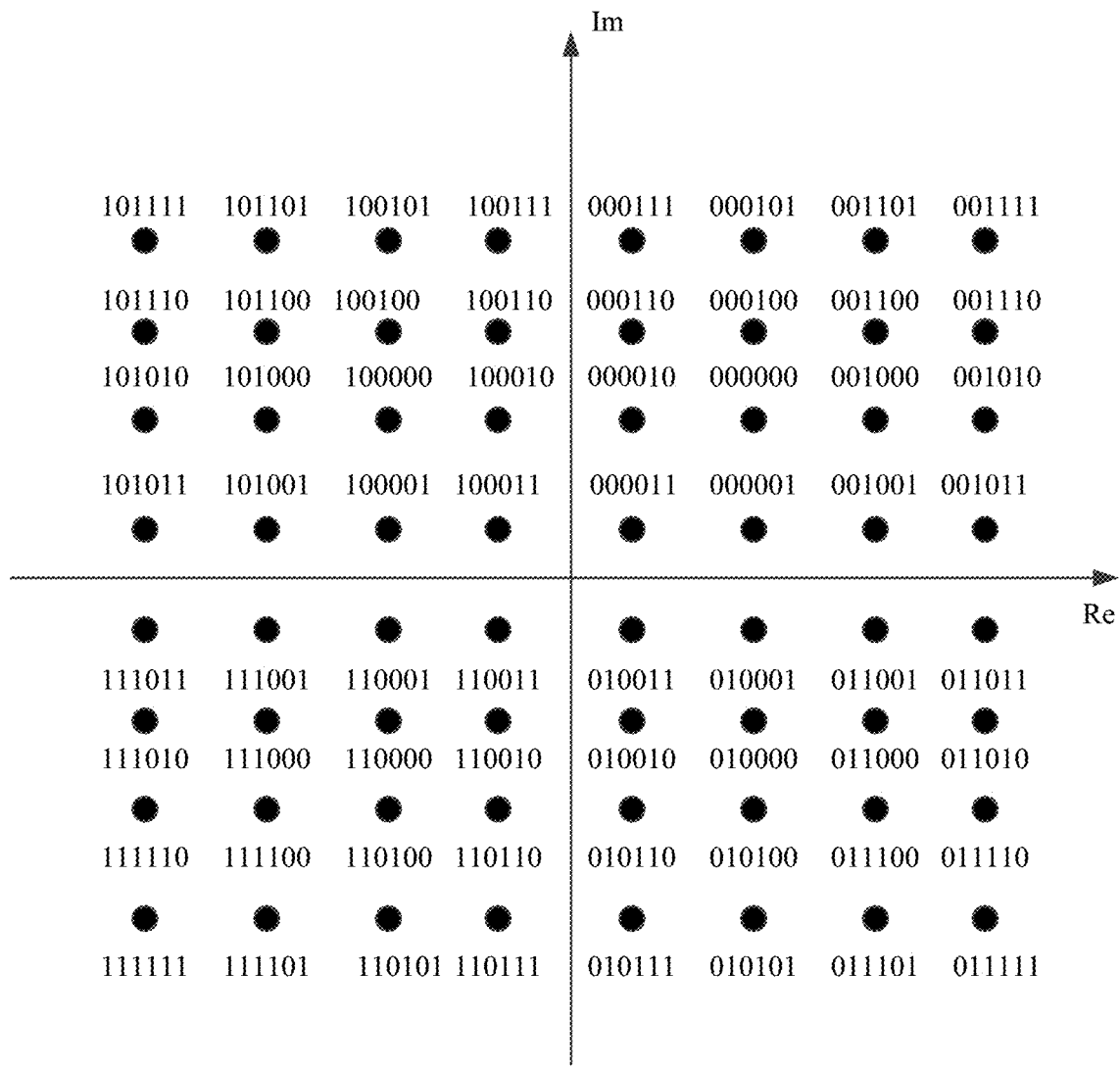
FIG. 4A to FIG. 4C are schematic diagrams of reliability levels of bit locations of a 64QAM modulation symbol, a 16QAM modulation symbol, and a QPSK modulation symbol in the prior art respectively.
Figure 4B:
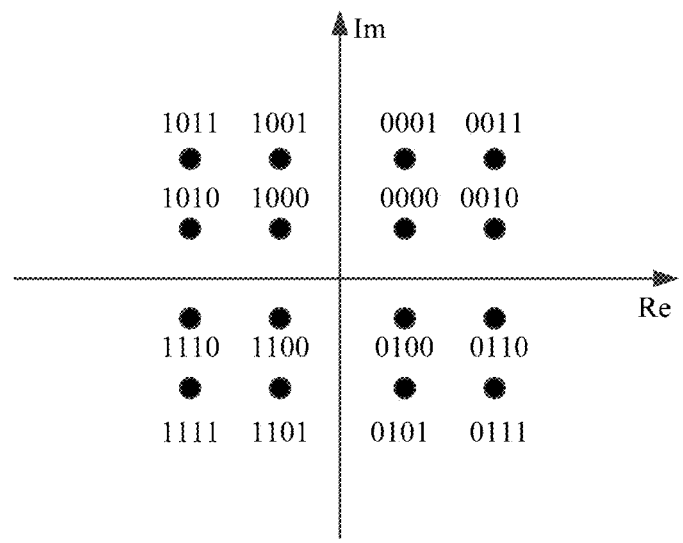
Figure 4C:
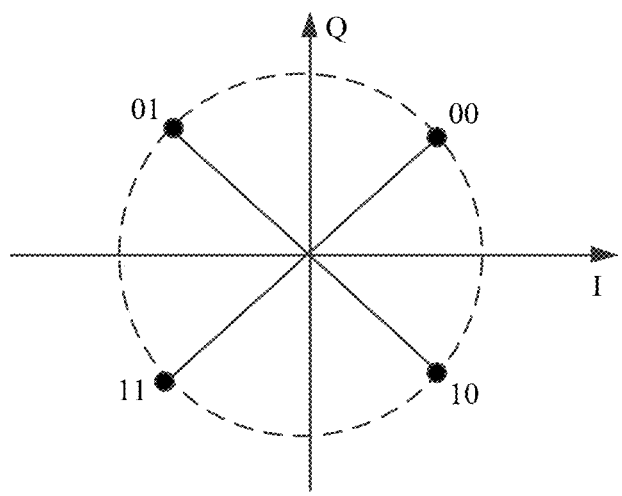

Within modulation symbols of a higher order modulation technology, bit locations have a reliability difference between each other, and bit locations of, for example, a 64QAM modulation symbol, a 16QAM modulation symbol, and a QPSK modulation symbol have different reliability. Therefore, the different reliability may be divided into a plurality of reliability levels. For example, the reliability levels are arranged in descending order, and are sequentially "first reliability", "second reliability", and "third reliability", as shown in FIG. 4A, FIG. 4B, and FIG. 4C. FIG. 4A is a constellation diagram of 64QAM modulation symbols, FIG. 4B is a constellation diagram of 16QAM modulation symbols, and FIG. 4C is a constellation diagram of QPSK modulation symbols. In FIG. 4A, each of the 64QAM modulation symbols includes six bit locations, and a 64QAM modulation symbol is represented by using $(I_0Q_0I_1Q_1I_2Q_2)$, where reliability levels of first two bit locations of each 64QAM modulation symbol are "first reliability", that is, $I_0$ and $Q_0$; reliability levels of middle two bit locations of each 64QAM modulation symbol are "second reliability", that is, $I_1$ and $Q_1$; and reliability levels of last two bit locations of each 64QAM modulation symbol are "third reliability", that is, $I_2$ and $Q_2$. In FIG. 4B, each of the 16QAM modulation symbols includes four bit locations, and a 16QAM modulation symbol is represented by using $(I_0Q_0I_1Q_1)$, where reliability levels of first two bit locations of each 16QAM modulation symbol are "first reliability", that is, $I_0$ and $Q_0$; and reliability levels of last two bit locations of each 16QAM modulation symbol are "second reliability", that is, $I_1$ and $Q_1$. In FIG. 4C, each of the QPSK modulation symbols includes two bit locations, and a QPSK modulation symbol is represented by using $(I_0Q_0)$, where reliability levels of both the first bit location and the second bit location of each QPSK modulation symbol are "first reliability", that is, $I_0$ and $Q_0$. Certainly, there are a plurality of types of higher order modulation symbols that are not listed one by one herein.

After at least one modulation symbol is obtained by using the foregoing modulation scheme, when the at least one modulation symbol is transmitted by using the HARQ technology, merging of retransmission packets increases a reliability difference between bit locations within a modulation symbol. As a result, a bit error rate is increased. After the bit error rate is increased, because the receive end of the wireless communications system cannot correctly perform decoding, a plurality of times of retransmission are required, increasing a delay, and affecting transmission performance of the wireless communications system.

In view of this, an embodiment of the present invention provides a data processing method. The method is applied to a wireless communications system. In the method, a transmit end in the wireless communications system first determines an information bit field and a first parity bit field, or an information bit field, a first parity bit field, and a second parity bit field based on an encoding matrix and a to-be-sent data block; and then determines L to-be-sent bits in the plurality of bit fields, where the L to-be-sent bits include at least one bit field, the at least one bit field is at least one of the information bit field and the first parity bit field or the at least one bit field is at least one of the information bit field, the first parity bit field, and the second parity bit field, and the at least one bit field has at least one prioritization manner. Finally, the transmit end maps, based on a rule that a bit in a bit field having a high priority is preferentially mapped to a bit location that is of the at least one modulation symbol and that has a high reliability level, the L to-be-sent bits to L bit locations included in the at least one modulation symbol, and outputs the at least one modulation symbol, where the information bit field is a bit sequence the same as a to-be-sent data block or a bit sequence obtained by performing weighted-type transform processing on a to-be-sent data block, the first parity bit field is a bit field obtained by encoding the to-be-sent data block by using a first part of an encoding matrix, and the second parity bit field is a bit field obtained by encoding the to-be-sent data block by using a second part of the encoding matrix.

Through the foregoing method, during data transmission, the transmit end obtains, through the to-be-sent data block and the encoding matrix, the at least one bit field included in the L to-be-sent bits, and allocates a priority to each bit field, for example, allocates a relatively high priority to an important bit field. In this way, when the L to-be-sent bits are mapped, the important bit field in the L to-be-sent bits is mapped to a bit location that is of the at least one modulation symbol and that has a high reliability level, to increase reliability of the important bit field in a transmission process, thereby reducing a bit error rate of the wireless communications system and improving transmission performance of the wireless communications system.

Technical solutions in embodiments of the present invention are described in detail below with reference to the accompanying drawings and specific implementations of the specification. In the following description process, an example in which the technical solutions provided in the embodiments of the present invention are applied to the application scenario shown in FIG. 1 and the technical solutions are applied to a network device transmitting data to a terminal device is used. Certainly, the technical solutions may also be applied to a terminal device transmitting data to a network device. This is not limited herein.

Figure 5:
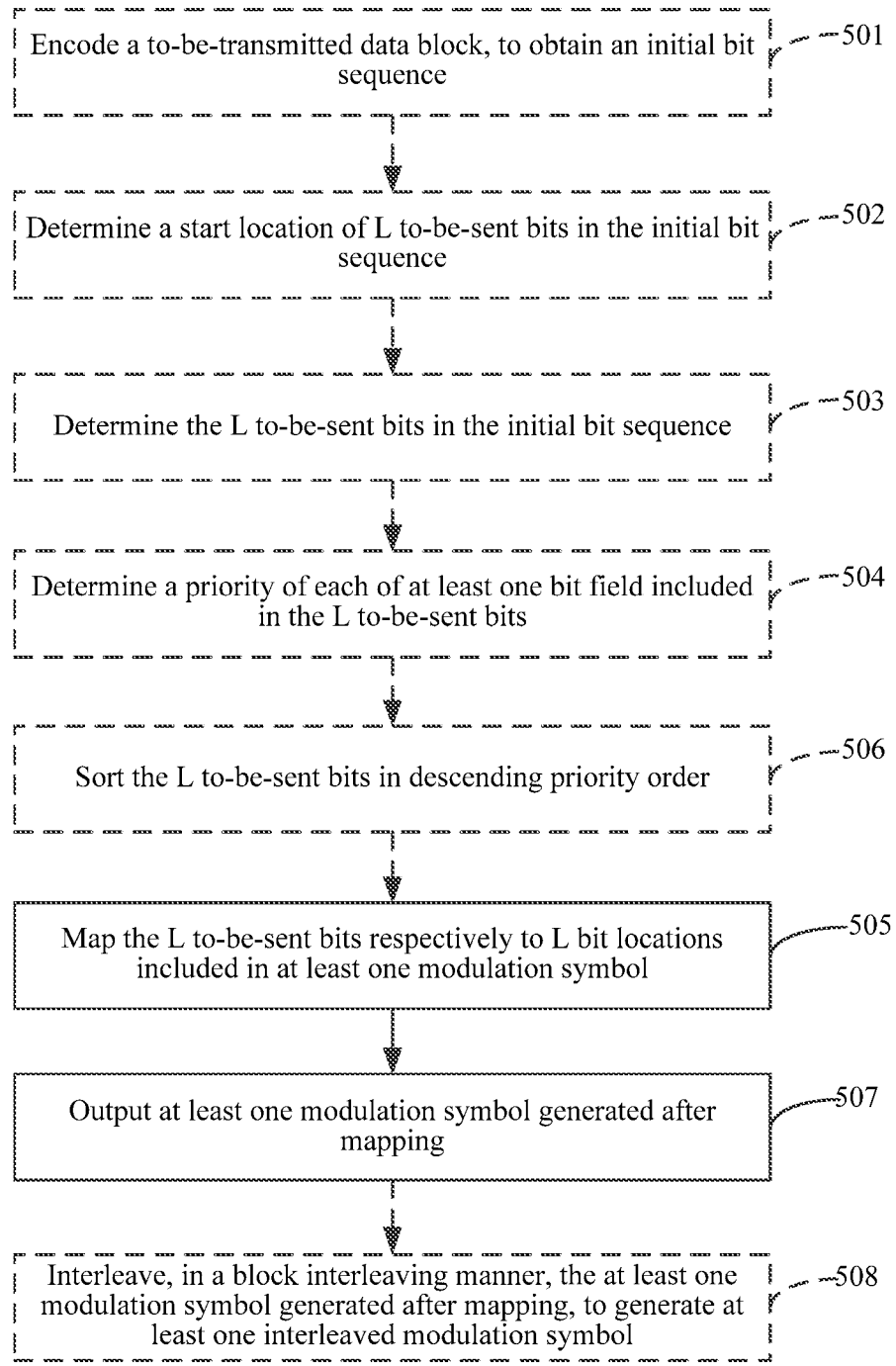
FIG. 5 is a flowchart of a data processing method according to an embodiment of the present invention.

Referring to FIG. 5, an embodiment of the present invention provides a data processing method, and a procedure of the method is described as follows:

Step 501: A network device encodes a to-be-transmitted data block, to obtain an initial bit sequence.

When transmitting data to a terminal device, the network device first obtains the to-be-transmitted data block, and then encodes the data block based on a preset encoding matrix. The preset encoding matrix may be an encoding matrix used in LDPC encoding, may be an encoding matrix used in RM encoding, or may be an encoding matrix used in polar encoding, and certainly may alternatively be an encoding matrix in another encoding manner. This is not limited in this embodiment of the present invention. There may be one preset encoding matrix in the network device. In this way, provided that the network device needs to transmit data, one encoding manner is used. Alternatively, there may be a plurality of preset encoding matrices in the network device, so that the network device may determine different encoding matrices based on a channel capacity, configuration information, an application scenario, or the like of the wireless communications system.

In this embodiment of the present invention, the preset encoding matrix may be one of a plurality of types of encoding matrices, but each encoding matrix has one of the following two structures:

First Matrix Structure:

An encoding matrix includes a first part and a second part, where the first part includes a symmetric matrix having a size of a1×a1 and having same elements located on a major diagonal and a minor diagonal or a non-symmetric matrix, and a matrix of a1×N; and the second part includes a symmetric matrix having a size of a2×a2 and having same elements located on a major diagonal and a matrix of a2×M, where a1, a2, M, and N are positive integers greater than 1.

Second Matrix Structure:

An encoding matrix includes a symmetric matrix having a size of a1×a1 and having same elements located on a major diagonal and a minor diagonal or a non-symmetric matrix, and a matrix of a1×N, where a1 and N are positive integers greater than 1. In this case, the encoding matrix includes only the first part in the first encoding structure.

When the network device encodes the to-be-transmitted data block, the to-be-transmitted data block may be encoded by directly using the preset encoding matrix; or the preset encoding matrix may be first expanded by using a matrix of Z×Z, to obtain an expanded encoding matrix, and then the data block is encoded by using the expanded encoding matrix. The matrix of Z×Z may be one of an all-zero matrix having a size of Z×Z, an identity matrix, or a matrix obtained after column cyclic shift is performed on an identity matrix, where Z is an expansion factor, and Z is a positive integer greater than or equal to 2.

Because structures of preset encoding matrices are different, structures of initial bit sequences obtained by the network device after encoding are also different. Based on the two structures of the preset encoding matrices, the initial bit sequences also have two structures:

First Bit Structure:

When the preset encoding matrix is of the first matrix structure, the initial bit sequence obtained by the network device includes an information bit field S, a first parity bit field P1, and a second parity bit field P2. The information bit field S is a bit sequence the same as a to-be-sent data block or a bit sequence obtained by performing weighted-type transform processing on a to-be-sent data block. For example, the to-be-sent data block is "01101101", and the information bit field S is also "01101101"; or the to-be-sent data block is "01101101", the to-be-sent data block is multiplied by a weighted matrix, an obtained bit sequence is the information bit field S, and the weighted matrix may be an invertible matrix or the like. This is not limited herein. The first parity bit field P1 is a bit field obtained by encoding the to-be-sent data block by using the first part of the preset encoding matrix, may be a bit field obtained by encoding the to-be-sent data block by using all elements of the first part, or may be a bit field obtained by encoding the to-be-sent data block by using some elements of the first part. The second parity bit field P2 is a bit field obtained by encoding the to-be-sent data block by using the second part of the preset encoding matrix, may be a bit field obtained by encoding the to-be-sent data block by using all elements of the second part, or may be a bit field obtained by encoding the to-be-sent data block by using some elements of the second part.

Second Bit Structure:

When the preset encoding matrix is of the second matrix structure, the initial bit sequence obtained by the network device includes an information bit field S and a first parity bit field P1. Definitions of the information bit field S and the first parity bit field P1 in the second bit structure are the same as those of the information bit field S and the first parity bit field P1 in the first bit structure. Details are not repeated herein.

In an example implementation, the information bit fields in the two bit structures may be further divided into a first information bit field S1 and a second information bit field S2. The first information bit field S1 is a bit field corresponding to first K columns of elements of first N columns of elements of the first part. For example, K is 2. The second information bit field S2 is a bit field corresponding to elements of the first N columns of elements other than the first K columns of elements. In an actual use process, it may be determined, based on the channel capacity, the configuration information, or the like of the wireless communications system, that the structure of the initial bit sequence is one of the foregoing bit structures. This is not limited herein.

In this embodiment of the present invention, the method according to this embodiment of the present invention is described in detail by using an example in which the preset encoding matrix is the encoding matrix, that is, LDPC code used in the LDPC encoding and the structure of the LDPC code is the first matrix structure.

Figure 6:
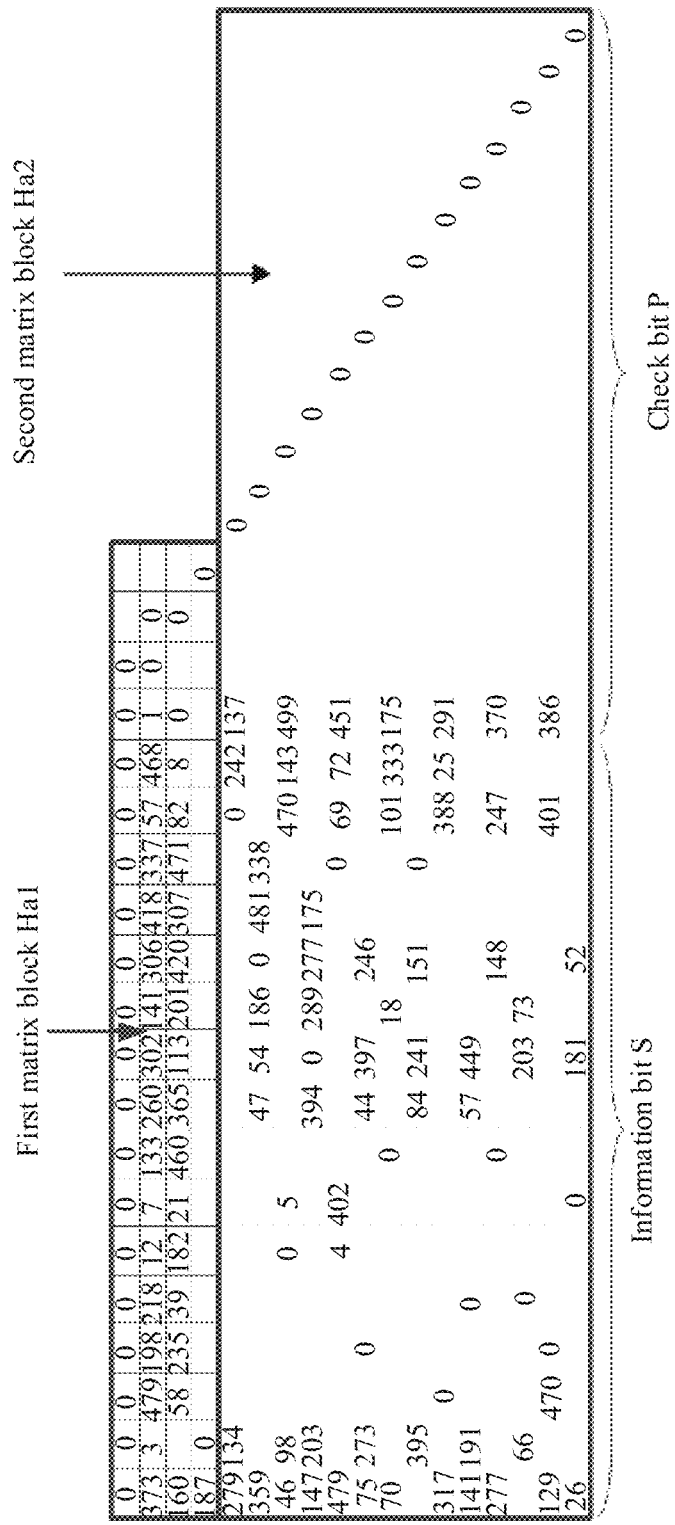
FIG. 6 is a schematic structural diagram of an LDPC code in the prior art.
Figure 7:
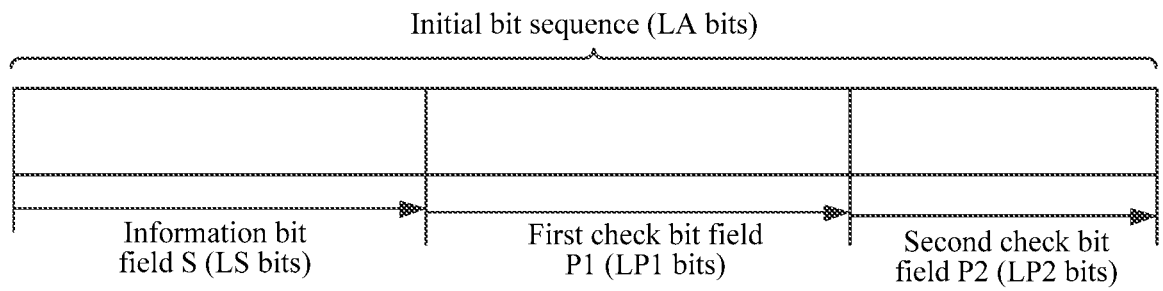
FIG. 7 is a schematic diagram of LA initial bit sequences obtained after a network device encodes a to-be-transmitted data block by using an expanded LDPC code according to an embodiment of the present invention.

A size of the LDPC code is mb×nb. In an example implementation, mb=18, and nb=34, as shown in FIG. 6. A first part of the LDPC code includes matrix elements of a left block in FIG. 6, and a second part includes matrix elements of a right block in FIG. 6. After the LDPC code is expanded by using an expansion factor Z, and then a to-be-transmitted data block is encoded by using the expanded LDPC code, an initial bit sequence shown in FIG. 7 is obtained, and a bit quantity of the initial bit sequence is LA. A quantity of bits included in the information bit field S is LS, and is the same as that of bits included in a bit sequence in the to-be-transmitted data block. The first parity bit field P1 is a bit sequence obtained by encoding the to-be-transmitted data block by using the first part of the LDPC code, and a quantity of bits included in the bit sequence is LP1. The second parity bit field P2 is a bit sequence obtained by encoding the to-be-transmitted data block by using the second part of the LDPC code, and a quantity of bits included in the bit sequence is LP2.

Step 502: Determine a start location of L to-be-sent bits in the initial bit sequence.

In an example implementation, the network device may determine the start location of the L to-be-sent bits by using a start location determining method in the prior art. Details are not repeated herein.

In an example implementation, the network device may determine the start location of the L to-be-sent bits by using the following method:

A $(V+1)^{th}$ bit of the initial bit sequence is determined as the start location of the L to-be-sent bits, where $0 \leq V < LA$. A method for determining a value of V is as follows:

Method 1: A value of V is determined based on the bit quantity LA of the initial bit sequence, the expansion factor Z, and the RV, and a calculation method satisfies:

$$V = RV_1 \times Z + V0, \quad (1)$$

where V0 is an integer, for example, V0 is an integral multiple of the expansion factor Z; and $RV_1$ is an integer that is of all values of the RV and that is less than or equal to a column quantity nb of the preset encoding matrix, and $$0 \leq RV < f\left(\frac{LA - V0}{Z}\right), \text{ where } f(t) = t, f(t) = \lceil t \rceil, \text{ or}$$

$$f(t) = \lfloor t \rfloor, \text{ and } t = \frac{LA - V0}{Z}.$$

It should be noted that, nb has a plurality of values, may vary according to an actual application, and may be a maximum value of the column quantity nb of the preset encoding matrix, for example, 34, or may be a minimum value of the column quantity nb of the preset encoding matrix, for example, 20.

The start location of the L to-be-sent bits determined through the foregoing method is an integral multiple of Z, so that the wireless communications system can support packet-level rate matching having Z as a packet unit and adaptive scheduling transmission. Moreover, because $RV_1$ is the integer that is of all the values of the RV and that is less than or equal to the column quantity nb of the preset encoding matrix, overheads of control information of the RV may be dynamically adjusted based on a size of the actually used encoding matrix, that is, do not exceed $\lceil \log_2(nb) \rceil$. For example, when nb=32, information overheads of the RV do not exceed 5 bits, so that the overheads of the control information of the RV of the wireless communications system may be reduced.

$$V = f\left(\frac{LA}{Ntx}\right) \times RV_1 + V0, \ RV_1 = 0, \Lambda, Ntx - 1, \quad (2)$$

$$V = f\left(\frac{LA}{Z2}\right) \times RV_1 \times Z1 + V0, \ RV_1 = 0, \Lambda, Ntx - 1,$$

$$V = \begin{cases} f\left(\frac{L1}{N1}\right) \times RV_1 + V0, \ RV_1 = 0, \Lambda, N1 - 1 \\ f\left(\frac{LA - L1}{Ntx - N1}\right) \times (RV_1 - N1) + L1, \ RV = N1, \Lambda, Ntx - 1 \end{cases}, \text{ or}$$

$$V = \begin{cases} f\left(\frac{L1}{Z3}\right) \times RV_1 \times Z1 + V0, \ RV_1 = 0, \Lambda, N1 - 1 \\ f\left(\frac{LA - L1}{Z4}\right) \times (RV_1 - N1) \times Z1 + L1, \ RV = N1, \Lambda, Ntx - 1 \end{cases}$$

V0 is an integer, for example, V0 is an integral multiple of the expansion factor Z; Ntx is a positive integer, for example, Ntx is a maximum quantity of transmission times of the initial bit sequence, one transport block (TB), or one code block (CB), or Ntx is a quantity of all values of the RV. $RV_1$ is an integer greater than or equal to 0 and less than Ntx. For example, $RV_1$ may be one of all the values of the RV. Z1 is a positive integral multiple of the expansion factor Z, Z2 is a common multiple of Z1 and Ntx, Z3 is a common multiple of Z1 and N1, and Z4 is a common multiple of Z1 and (Ntx−N1). L1=LS+LP1.

$$N1 = f\left(\frac{Ntx \times L1}{LA}\right), \text{ where } f(t) = t, \ f(t) = \lceil t \rceil, \text{ or } f(t) = \lfloor t \rfloor,$$

$$\text{and } t = \frac{LA - V0}{Z}$$

In an example implementation, a value of Ntx may be further set based on a different application scenario of the wireless communications system or the preset encoding matrix in the network device. As shown in Table 1 and Table 2, in Table 1, when the wireless communications system is applied to an ultra-reliable and low latency communications (URLLC) scenario, the value of Ntx is 1 and/or 2. To be specific, Ntx may be one fixed value, or may have two values. When Ntx has two values, a specific value of Ntx may be determined by using a method shown in Table 2. For example, when a size of an encoding matrix is 10×20, the value of Ntx is 1; and when a size of an encoding matrix is 8×32, the value of Ntx is 2. When the wireless communications system is applied to an enhanced mobile broadband (eMBB) scenario, the value of Ntx is 4 and/or 6. When the wireless communications system is applied to a massive machine type communications (mMTC) scenario, the value of Ntx is 6 and/or 8. In Table 2, an encoding matrix 1, an encoding matrix 2, and an encoding matrix 3 represent three different encoding matrices, and are encoding matrices having different sizes respectively. For example, the sizes of the encoding matrix 1, the encoding matrix 2, and the encoding matrix 3 may be 10×20, 8×32, and 20×60 respectively. The value of Ntx is related to a column quantity of an encoding matrix, and a larger column quantity of an encoding matrix indicates a larger value of Ntx. Using an example in which the sizes of the encoding matrix 1, the encoding matrix 2, and the encoding matrix 3 may be 10×20, 8×32, and 20×60 respectively, a column quantity of the encoding matrix 1 is 20, and the value of Ntx is 2 and/or 4; a column quantity of the encoding matrix 2 is 32, and the value of Ntx is 6; and a column quantity of the encoding matrix 3 is 60, and the value of Ntx is 8.

TABLE 1

| Scenario | Ntx |
|---|---|
| URLLC | 1 and/or 2 |
| eMBB | 4 and/or 6 |
| mMTC | 6 and/or 8 |

TABLE 2

| Preset encoding matrix | Ntx |
|---|---|
| Encoding matrix 1 | 2 and/or 4 |
| Encoding matrix 2 | 6 |
| Encoding matrix 3 | 8 |

When the start location of the L to-be-sent bits is determined through the foregoing method, because Ntx may be the maximum quantity of transmission times of one TB or one CB, the overheads of the control information of the RV of the wireless communications system may be dynamically adjusted based on the maximum quantity of transmission times: the overheads of the control information of the RV are $\lceil \log_2(Ntx) \rceil$. For example, it is defined in an LTE system that a maximum quantity Ntx of transmission times of one TB block is 4, so that the overheads of the control information of the RV are 2 bits, and the overheads of the control information of the RV of the wireless communications system may be reduced.

Method 2: A value of V is determined based on the bit quantity LA of the initial bit sequence, a quantity L of the to-be-sent bits, and the RV, and a calculation method satisfies:

$$V=(RV_1 \times L+V0) \bmod LA.$$

$RV_1$ is an integer greater than or equal to 0 and less than Ntx, and the definition and the value of Ntx are the same as those in the method 1. Details are not repeated herein. The bit quantity L of the L to-be-sent bits may be preset. For example, the LTE system allows a quantity of bits transmitted each time not to exceed 4536, and therefore L is an integer less than or equal to 4536.

When the start location of the L to-be-sent bits is determined through the foregoing method, because Ntx may be a maximum quantity of transmission times of one CB, and the value of L is determined based on a resource allocation size configured by default and is a fixed value, code blocks of the wireless communications system correspond to a same start location, and the wireless communications system can support code-block-level rate matching having a CB as a packet unit and SPS scheduling transmission.

Method 3: A value of V is determined based on the bit quantity LA of the initial bit sequence, and the RV, and a calculation method satisfies:

$$V=RV_1+V0,$$

where $RV_1$ is a positive integer less than (LA−V0).

When the start location of the L to-be-sent bits is determined through the foregoing method, because the value of $RV_1$ is determined based on the bit quantity LA and V0, the wireless communications system can support bit-level rate matching having a bit as a packet unit and adaptive scheduling transmission. Correspondingly, the overheads of the control information of the RV are $\lceil \log_2 (LA-V0) \rceil$. For example, the wireless communications system is applied to an encoding scenario in which a bit quantity of a to-be-sent data block is 16 and an encoding code rate is ¼. In this case, the bit quantity LA of the initial bit sequence is 64, and the overheads of the control information of the RV do not exceed 6 bits, so that the overheads of the control information of the RV of the wireless communications system may be reduced.

Figure 8:
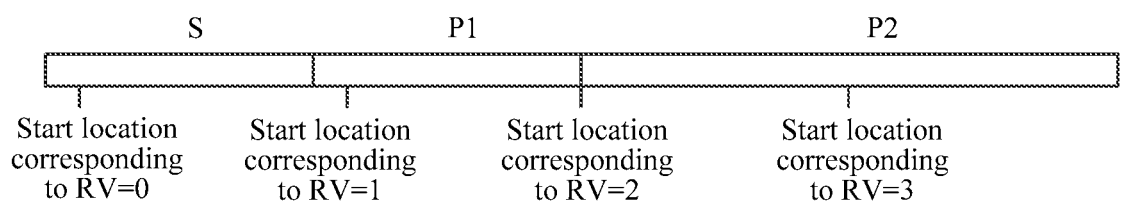
FIG. 8 is a schematic diagram of four start locations determined by a network device based on values of four RVs according to an embodiment of the present invention.

After the value of V is determined, the network device determines several start locations based on the value of V, and a quantity of the start locations is the same as a quantity of values of the RV. Using an example in which the values of the RV are 0, 1, 2, and 3, the network device determines four values of V based on the quantity of values of the RV, and then determines four start locations shown in FIG. 8.

It should be noted that, during each time of transmission, the network device selects only one start location corresponding to this time of transmission from a plurality of determined start locations, for example, may select any start location from the plurality of start locations as the start location corresponding to this time of transmission; or may fixedly configure a value of the RV for each time of transmission in advance, first determine, during each time of transmission, a value of the RV corresponding to this time of transmission, and then select a start location corresponding to the determined value of the RV from a plurality of start locations as a start location of this time of transmission. For example, it is preset that a value of the RV during initial transmission is 0, a value of the RV during the first time of retransmission is 2, and a value of the RV during the second time of retransmission is 4. If this time of transmission is the initial transmission, a start location corresponding to the RV equal to 0 is selected as a start location of the initial transmission.

Step 503: Determine the L to-be-sent bits in the initial bit sequence.

After determining a plurality of start locations, the network device sequentially reads L bits, that is, the L to-be-sent bits from the initial bit sequence based on the corresponding value of the RV during this time of transmission. In this embodiment of the present invention, a value of L may be preset. For example, the network device can determine a bit quantity L of the to-be-sent bits based on a resource allocation size configured by default or configured dynamically.

Figure 9A:
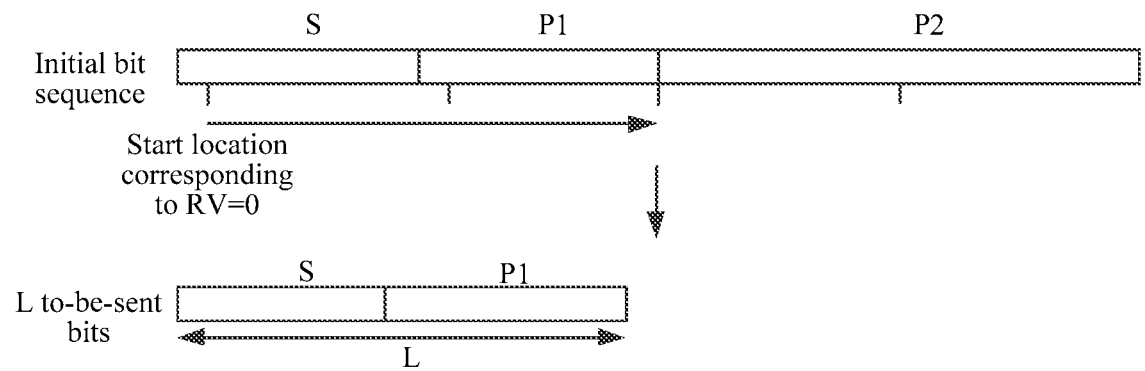
FIG. 9A and FIG. 9B are schematic diagrams of L to-be-sent bits determined by a network device based on values of different RVs according to an embodiment of the present invention.

Referring to FIG. 9A, if a corresponding RV during current transmission is equal to 0, the network device sequentially obtains L bits from a start location corresponding to the RV equal to 0, to obtain L to-be-sent bits.

Figure 9B:
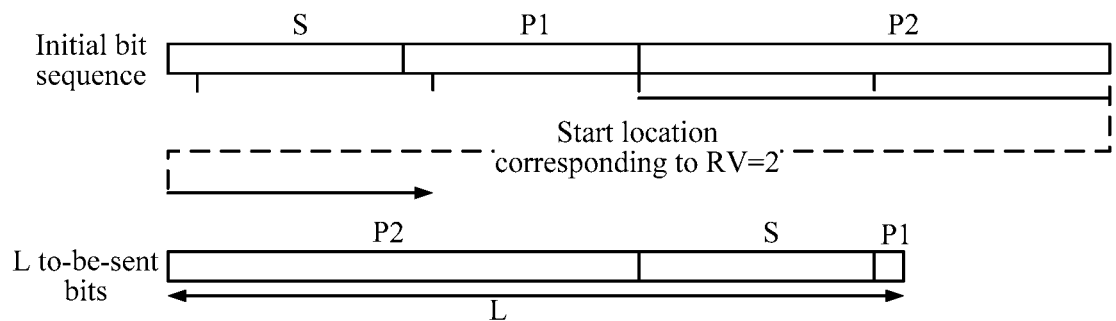

Referring to FIG. 9B, if a corresponding RV during current transmission is equal to 2, the network device cyclically obtains L bits from a start location corresponding to the RV equal to 2, to obtain L to-be-sent bits.

Step 504: Determine a priority of each of at least one bit field included in the L to-be-sent bits.

After the network device determines the L to-be-sent bits in the initial bit sequence, the network device first determines the at least one bit field included in the L to-be-sent bits. For example, the L to-be-sent bits are L bits shown in FIG. 9B, and the L bits include all bits of a second parity bit field P2, all bits of an information bit field S, and some bits of a first parity bit field P1, so that the L to-be-sent bits include the information bit field S, the first parity bit field P1, and the second parity bit field P2. Then, a priority of each bit field is determined based on a prioritization manner. The prioritization manner may be one of a plurality of preset prioritization manners. In this embodiment of the present invention, the plurality of preset prioritization manners include the following ten prioritization manners:

First prioritization manner: a priority of the information bit field S is a first priority, a priority of the parity bit field P is a second priority, the first priority is higher than the second priority, and the parity bit field includes the first parity bit field P1 and/or the second parity bit field P2.

It should be noted that, when the L to-be-sent bits include the information bit field S and the first parity bit field P1, it is determined that the priority of the information bit field S is higher than that of the first parity bit field P1; or when the L to-be-sent bits include the information bit field S, the first parity bit field P1, and the second parity bit field P2, it is determined that the priority of the information bit field S is higher than those of the first parity bit field P1 and the second parity bit field P2, and the priority of the first parity bit field P1 is the same as the priority of the second parity bit field P2.

Second prioritization manner: a priority of the information bit field S is a first priority, a priority of the first parity bit field P1 is a second priority, a priority of the second parity bit field P2 is a third priority, the first priority is higher than the second priority, and the second priority is higher than the third priority.

Third prioritization manner: a priority of the information bit field S is a first priority, a priority of the second parity bit field P2 is a second priority, a priority of the first parity bit field P1 is a third priority, the first priority is higher than the second priority, and the second priority is higher than the third priority.

Fourth prioritization manner: a priority of the parity bit field P is a first priority, a priority of the information bit field S is a second priority, and the first priority is higher than the second priority.

It should be noted that, when the L to-be-sent bits include the information bit field S and the first parity bit field P1, it is determined that a priority of the first parity bit field P1 is higher than that of the information bit field S; or when the L to-be-sent bits include the information bit field S, the first parity bit field P1, and the second parity bit field P2, it is determined that each of a priority of the first parity bit field P1 and a priority of the second parity bit field P2 is the first priority, and the priority is higher than the priority of the information bit field S.

Fifth prioritization manner: a priority of the first parity bit field P1 is a first priority, a priority of the second parity bit field P2 is a second priority, and a priority of the information bit field S is a third priority, the first priority is higher than the second priority, and the second priority is higher than the third priority.

Sixth prioritization manner: a priority of the second parity bit field P2 is a first priority, a priority of the information bit field S is a second priority, a priority of the first parity bit field P1 is a third priority, the first priority is higher than the second priority, and the second priority is higher than the third priority.

Seventh prioritization manner: a priority of the first parity bit field P1 is a first priority, a priority of the information bit field S is a second priority, a priority of the second parity bit field P2 is a third priority, the first priority is higher than the second priority, and the second priority is higher than the third priority.

Eighth prioritization manner: a priority of the first parity bit field is a first priority, a priority of the second parity bit field is a second priority, and the first priority is higher than the second priority.

Ninth prioritization manner: a priority of the second parity bit field is a first priority, a priority of the first parity bit field is a second priority, and the first priority is higher than the second priority.

Tenth prioritization manner: a priority of the second parity bit field is a first priority, a priority of the first parity bit field is a second priority, a priority of the information bit field is a third priority, the first priority is higher than the second priority, and the second priority is higher than the third priority.

It should be noted that, the L to-be-sent bits may not include the information bit field. For example, only the first parity bit field and the second parity bit field may be retransmitted during retransmission. Moreover, the L to-be-sent bits may include only one bit field. In this case, the L to-be-sent bits have a same priority. For example, the L to-be-sent bits are of the first priority.

In this embodiment of the present invention, all or some of the foregoing prioritization manners may be implemented through a constellation rearrangement technology.

When the network device initially transmits the to-be-sent data block, the network device may select one prioritization manner from the foregoing ten prioritization manners, to prioritize the at least one bit field included in the L to-be-sent bits.

To further reduce a bit error rate of the wireless communications system during data transmission, the following operations are performed on a prioritization manner used by the network device when retransmitting the to-be-sent data block:

First operation: when the network device retransmits the to-be-sent data block, the network device may select a prioritization manner different from a prioritization manner used when the to-be-sent data block is initially transmitted, to prioritize the at least one bit field included in the to-be-sent bits during retransmission. For example, initial transmission of the to-be-sent data block corresponds to L first to-be-sent bits, and retransmission of the to-be-sent data block corresponds to L second to-be-sent bits. The L first to-be-sent bits include an information bit field S, a first parity bit field P1, and a second parity bit field P2, and the L second to-be-sent bits include an information bit field S, a first parity bit field P1, and a second parity bit field P2. If the second prioritization manner is used during initial transmission to determine a priority of the at least one bit field included in the L first to-be-sent bits, that is, the priority of the information bit field S is higher than the priority of the first parity bit field P1, and the priority of the first parity bit field P1 is higher than the priority of the second parity bit field P2, the network device needs to use a prioritization manner other than the second prioritization manner during retransmission to perform bit field prioritization on the L second to-be-sent bits. For example, the seventh prioritization manner may be used. Therefore, during retransmission, the priority of the first parity bit field P1 is higher than the priority of the information bit field S, and the priority of the information bit field S is higher than the priority of the second parity bit field P2.

It should be noted that, the L first to-be-sent bits may be completely the same as, partially the same as, or completely different from the L second to-be-sent bits. Additionally, a quantity of corresponding to-be-sent bits during initial transmission of the to-be-sent data block may be the same as or different from a quantity of corresponding to-be-sent bits during retransmission of the to-be-sent data block. For example, 16 to-be-sent bits are determined during initial transmission of the to-be-sent data block, and only 12 to-be-sent bits are determined during retransmission of the to-be-sent data block.

Second operation: when the network device retransmits the to-be-sent data block, the network device may select a prioritization manner different from a prioritization manner used when the to-be-sent data block is retransmitted last time, to prioritize the at least one bit field included in the to-be-sent bits during this time of retransmission. For example, L third to-be-sent bits corresponding to the to-be-sent data block are retransmitted for the second time, and L fourth to-be-sent bits corresponding to the to-be-sent data block are retransmitted for the third time. The L third to-be-sent bits include an information bit field S, a first parity bit field P1, and a second parity bit field P2, and the L fourth to-be-sent bits include an information bit field S, a first parity bit field P1, and a second parity bit field P2. If the second prioritization manner is used during the second time of retransmission to determine a priority of the at least one bit field included in the L third to-be-sent bits, a prioritization manner other than the second prioritization manner is used during the third time of retransmission to perform bit field prioritization on the L fourth to-be-sent bits.

It should be noted that, the L third to-be-sent bits may be completely the same as, partially the same as, or completely different from the L fourth to-be-sent bits. Additionally, a quantity of corresponding to-be-sent bits during the second time of retransmission of the to-be-sent data block may be the same as or different from a quantity of corresponding to-be-sent bits during the third time of retransmission of the to-be-sent data block. For example, 16 to-be-sent bits are determined during the second time of retransmission of the to-be-sent data block, and only 12 to-be-sent bits are determined during the third time of retransmission of the to-be-sent data block.

Additionally, during each time of transmission of the to-be-sent data block, at least one bit field included in determined to-be-sent bits may differ. For example, during initial transmission, determined L1 to-be-sent bits include an information bit field S and a first parity bit field P1, and during the first time of retransmission, determined L2 to-be-sent bits include an information bit field S, a first parity bit field P1, and a second parity bit field P2. In this case, if a prioritization manner used during initial transmission is the first prioritization manner, a prioritization manner used during the first time of retransmission is the second prioritization manner. Although the two prioritization manners are different, the priority of the information bit field S is the same as that of the first parity bit field P1 during the two times of transmission. As a result, the bit error rate of the wireless communications system during data transmission probably cannot be reduced. Therefore, the network device may determine, through a preset rule, a prioritization manner used during retransmission.

The preset rule may include the following two preset rules:

First preset rule: it is ensured that priorities of a particular bit field are different during a previous time of transmission and a next time of transmission. The particular bit field may be one bit field or a plurality of bit fields. For example, if the particular bit field is an information bit field S, the first prioritization manner is used during the previous time of transmission such as the initial transmission or the last time of retransmission; and only one of the fourth to the seventh prioritization manners can be selected according to the preset rule during the next time of transmission such as the first time of retransmission or the following time of retransmission. When the particular bit field is a plurality of bit fields, for example, the particular bit field is an information bit field and a first parity bit field, a specific implementation process of the preset rule is the same as that in a case in which the particular bit field is one bit field. Details are not repeated herein.

Second preset rule: it is ensured that priorities of a same bit field are different during a previous time of transmission and a next time of transmission. For example, bit fields during each of the previous time of transmission and the next time of transmission are an information bit field S, a first parity bit field P1, and a second parity bit field P2. The second prioritization manner is used during the previous time of transmission such as the initial transmission or the last time of retransmission. Only one of the fifth prioritization manner and the sixth prioritization manner can be selected according to the preset rule during the next time of transmission such as the first time of retransmission or the following time of retransmission, to ensure that a priority of each of the information bit field S, the first parity bit field P1, and the second parity bit field P2 is changed.

Figure 10:
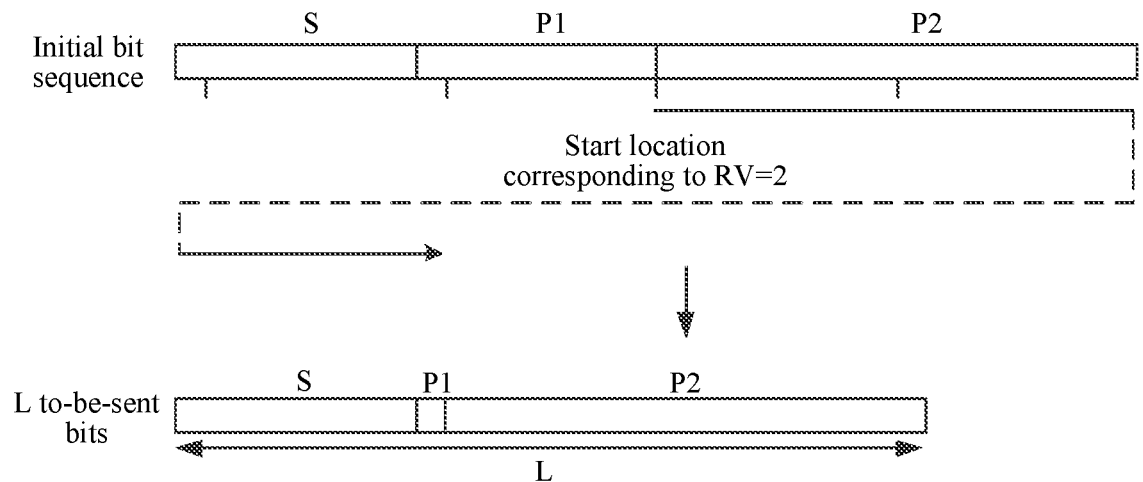
FIG. 10 is a schematic diagram of L to-be-sent bits obtained after a network device arranges the L to-be-sent bits in descending priority order according to an embodiment of the present invention.

In an example implementation, step 503 and step 504 may be merged for use. To be specific, the network device determines locations of L to-be-sent bits based on a start location, then determines at least one bit field included in the L to-be-sent bits based on the locations of the L to-be-sent bits, then determines a priority of each of the at least one bit field, and sequentially obtains the L bits in descending priority order, to obtain the L to-be-sent bits. Therefore, when the network device obtains the L to-be-sent bits, the L to-be-sent bits have been arranged in descending priority order. To be specific, a bit field having a high priority is arranged preceding a bit field having a low priority. Referring to FIG. 10, if a corresponding RV during this time of transmission is equal to 2, the network device determines that locations of L to-be-sent bits from a start location corresponding to an RV equal to 2 include all bits of a second parity bit field, all bits of an information bit field, and some bits of a first parity bit field, then determines, based on the second prioritization manner, that a priority of the information bit field is higher than a priority of the first parity bit field and the priority of the first parity bit field is higher than a priority of the second parity bit field, and then reads the L bits in descending priority order, to obtain the L to-be-sent bits shown in FIG. 10.

The bit fields in the L to-be-sent bits obtained by the network device are arranged in descending priority order.

Step 505: Map the L to-be-sent bits respectively to L bit locations included in at least one modulation symbol.

After the network device determines a priority of each of at least one bit field included in the L to-be-sent bits, a bit in a bit field having a high priority is mapped to a bit location that is of the at least one modulation symbol and that has a high reliability level.

In this embodiment of the present invention, because a prioritization manner used by the network device during each time of transmission may differ, bit locations to which the L to-be-sent bits are mapped during each time of transmission may also differ. Description is made below by using an example in which L to-be-sent bits are mapped to a 64QAM modulation symbol.

Figure 11A:
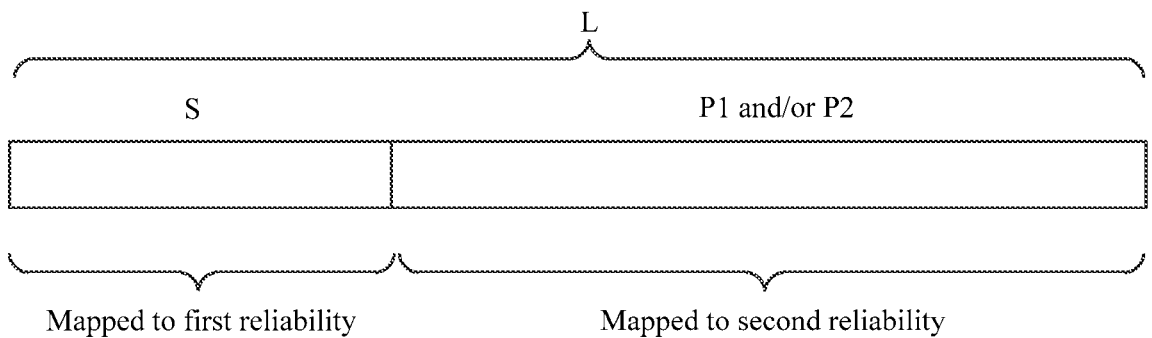
FIG. 11A to FIG. 11N are schematic diagrams of determining, by a network device, a priority of each bit field in L to-be-sent bits based on ten prioritization manners respectively according to an embodiment of the present invention.
Figure 11B:
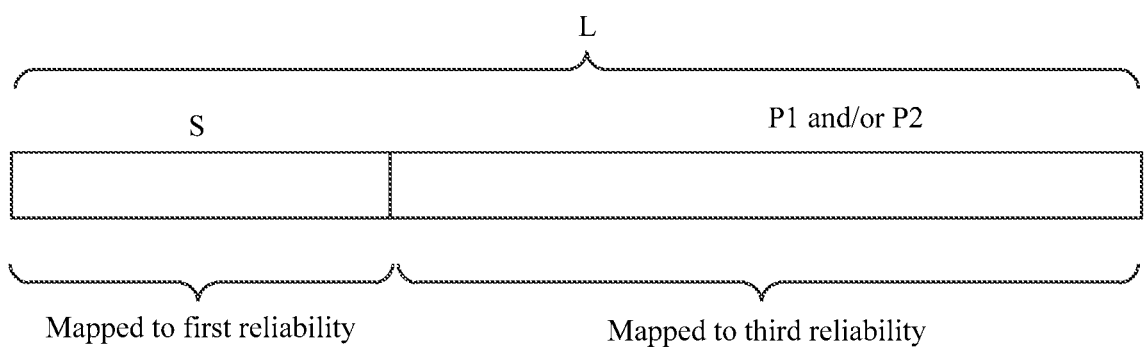

(1) The first prioritization manner is used to determine a priority of each bit field in the L to-be-sent bits. Therefore, a bit in an information bit field S is preferentially mapped to a bit location that is of the 64QAM modulation symbol and that has first reliability, that is, $I_0$ and/or $Q_0$ of 64QAM; and a bit in a parity bit field P is mapped to a bit location that is of the 64QAM modulation symbol and that has second reliability, that is, $I_1$ and/or $Q_1$ of 64QAM, as shown in FIG. 11A. Alternatively, a bit in an information bit field S is mapped to a bit location that is of the 64QAM modulation symbol and that has first reliability, that is, $I_0$ and/or $Q_0$ of 64QAM; and a bit in a parity bit field P is mapped to a bit location that is of the 64QAM modulation symbol and that has third reliability, that is, $I_2$ and/or $Q_2$ of 64QAM, as shown in FIG. 11B.

Figure 11C:
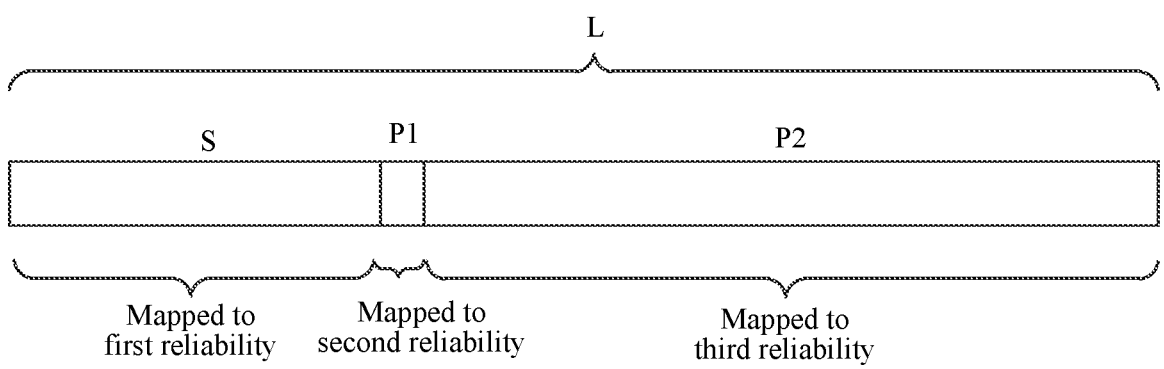

(2) The second prioritization manner is used to determine a priority of each bit field in the L to-be-sent bits. Therefore, a bit in an information bit field S is preferentially mapped to a bit location that is of the 64QAM modulation symbol and that has first reliability, that is, $I_0$ and/or $Q_0$ of 64QAM; a bit in a first parity bit field P1 is mapped to a bit location that is of the 64QAM modulation symbol and that has second reliability, that is, $I_1$ and/or $Q_1$ of 64QAM; and a bit in a second parity bit field P2 is mapped to a bit location that is of the 64QAM modulation symbol and that has third reliability, that is, $I_2$ and/or $Q_2$ of 64QAM, as shown in FIG. 11C.

Figure 11D:
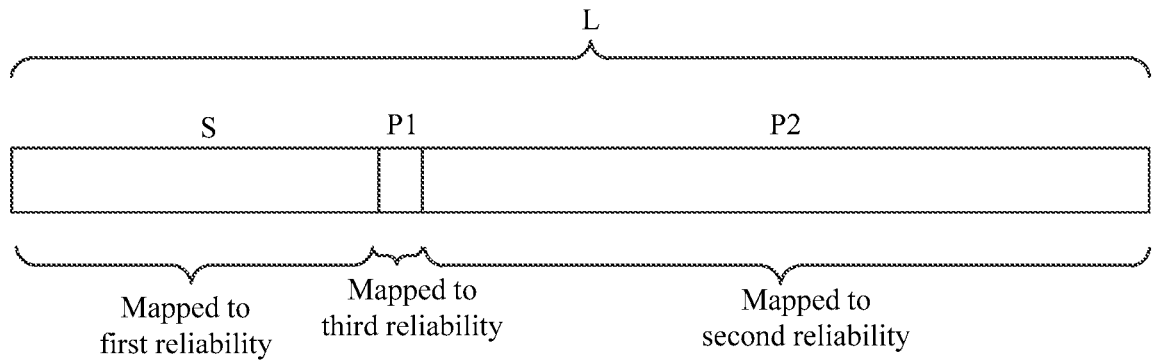

(3) The third prioritization manner is used to determine a priority of each bit field in the L to-be-sent bits. Therefore, a bit in an information bit field S is preferentially mapped to a bit location that is of the 64QAM modulation symbol and that has first reliability, that is, $I_0$ and/or $Q_0$ of 64QAM; a bit in a second parity bit field P2 is mapped to a bit location that is of the 64QAM modulation symbol and that has second reliability, that is, $I_1$ and/or $Q_1$ of 64QAM; and a bit in a first parity bit field P1 is mapped to a bit location that is of the 64QAM modulation symbol and that has third reliability, that is, $I_2$ and/or $Q_2$ of 64QAM, as shown in FIG. 11D.

Figure 11E:
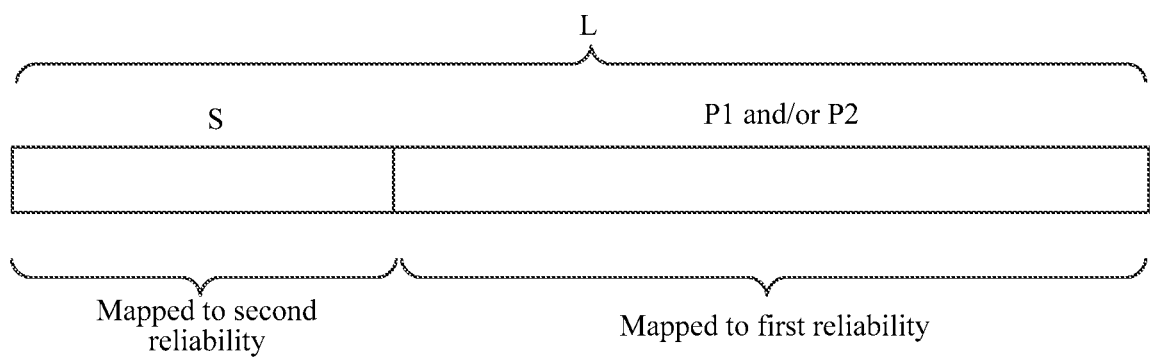
Figure 11F:
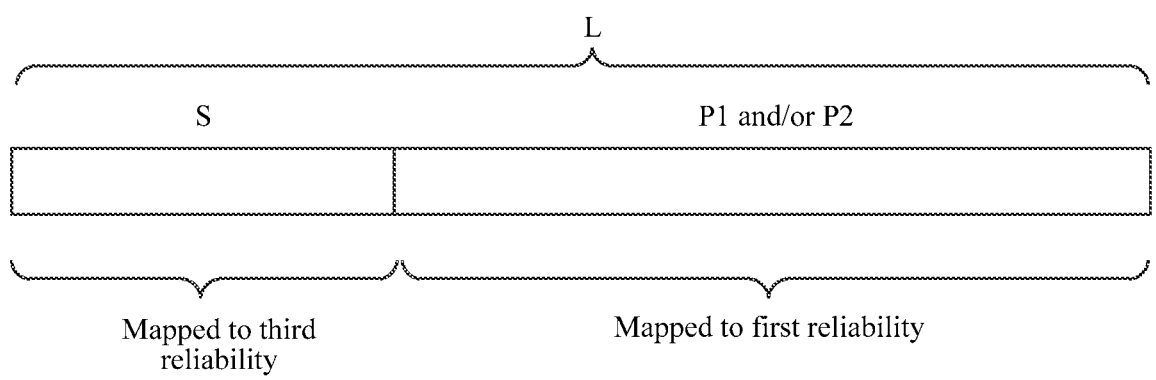

(4) The fourth prioritization manner is used to determine a priority of each bit field in the L to-be-sent bits. Therefore, a bit in a parity bit field P is preferentially mapped to a bit location that is of the 64QAM modulation symbol and that has first reliability, that is, $I_0$ and/or $Q_0$ of 64QAM; and a bit in an information bit field S is mapped to a bit location that is of the 64QAM modulation symbol and that has second reliability, that is, $I_1$ and/or $Q_1$ of 64QAM, as shown in FIG. 11E. Alternatively, a bit in a parity bit field P is mapped to a bit location that is of the 64QAM modulation symbol and that has first reliability, that is, $I_0$ and/or $Q_0$ of 64QAM; and a bit in an information bit field S is mapped to a bit location that is of the 64QAM modulation symbol and that has third reliability, that is, $I_2$ and/or $Q_2$ of 64QAM, as shown in FIG. 11F.

Figure 11G:
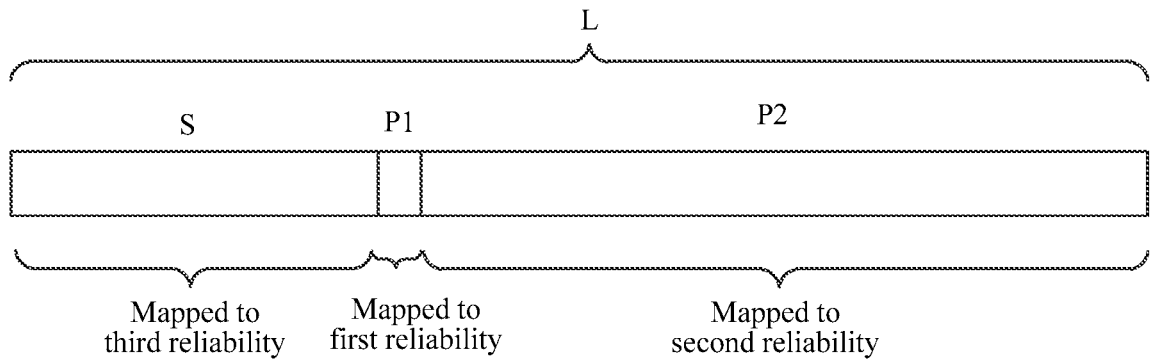

(5) The fifth prioritization manner is used to determine a priority of each bit field in the L to-be-sent bits. Therefore, a bit in a first parity bit field P1 is preferentially mapped to a bit location that is of the 64QAM modulation symbol and that has first reliability, that is, $I_0$ and/or $Q_0$ of 64QAM; a bit in a second parity bit field P2 is mapped to a bit location that is of the 64QAM modulation symbol and that has second reliability, that is, $I_1$ and/or $Q_1$ of 64QAM; and a bit in an information bit field S is mapped to a bit location that is of the 64QAM modulation symbol and that has third reliability, that is, $I_2$ and/or $Q_2$ of 64QAM, as shown in FIG. 11G.

Figure 11H:
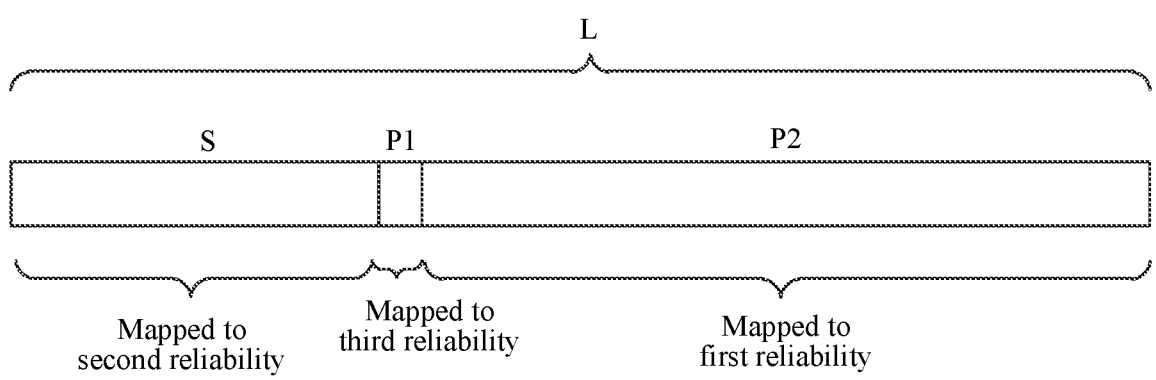

(6) The sixth prioritization manner is used to determine a priority of each bit field in the L to-be-sent bits. Therefore, a bit in a second parity bit field P2 is preferentially mapped to a bit location that is of the 64QAM modulation symbol and that has first reliability, that is, $I_0$ and/or $Q_0$ of 64QAM; a bit in an information bit field S is mapped to a bit location that is of the 64QAM modulation symbol and that has second reliability, that is, $I_1$ and/or $Q_1$ of 64QAM; and a bit in a first parity bit field P1 is mapped to a bit location that is of the 64QAM modulation symbol and that has third reliability, that is, $I_2$ and/or $Q_2$ of 64QAM, as shown in FIG. 11H.

Figure 11I:
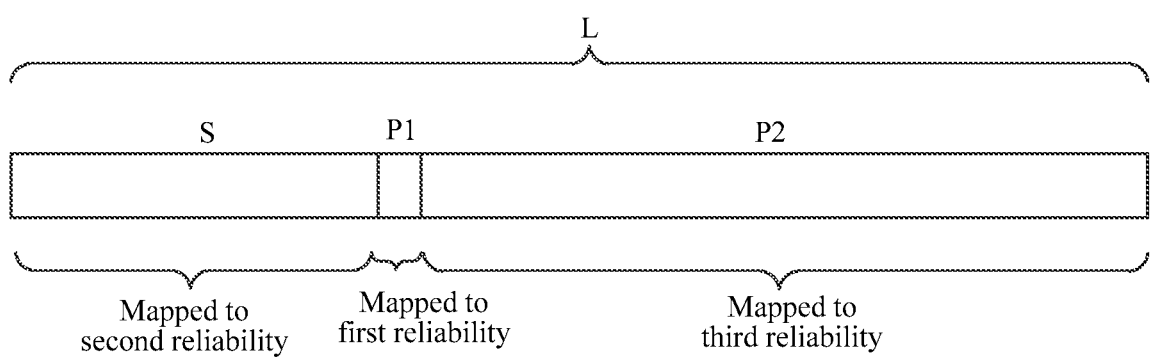

(7) The seventh prioritization manner is used to determine a priority of each bit field in the L to-be-sent bits. Therefore, a bit in a first parity bit field P1 is preferentially mapped to a bit location that is of the 64QAM modulation symbol and that has first reliability, that is, $I_0$ and/or $Q_0$ of 64QAM; a bit in an information bit field S is mapped to a bit location that is of the 64QAM modulation symbol and that has second reliability, that is, $I_1$ and/or $Q_1$ of 64QAM; and a bit in a second parity bit field P2 is mapped to a bit location that is of the 64QAM modulation symbol and that has third reliability, that is, $I_2$ and/or $Q_2$ of 64QAM, as shown in FIG. 11I.

Figure 11J:
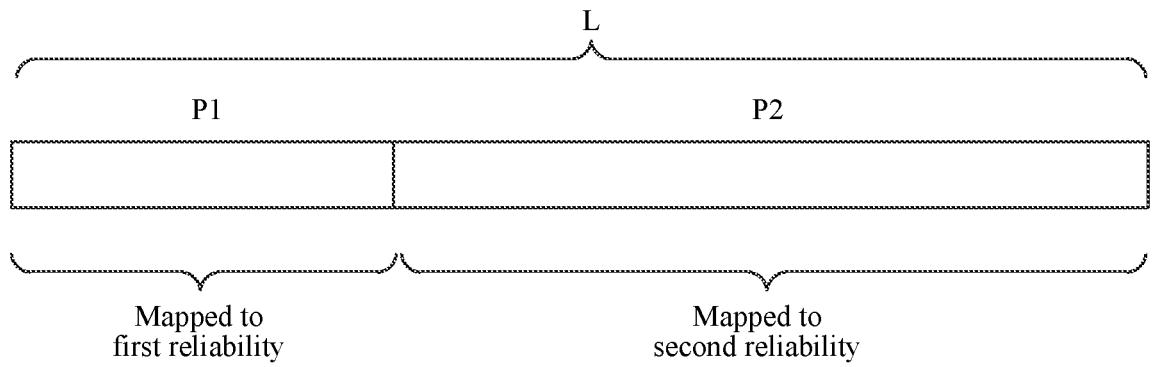
Figure 11K:
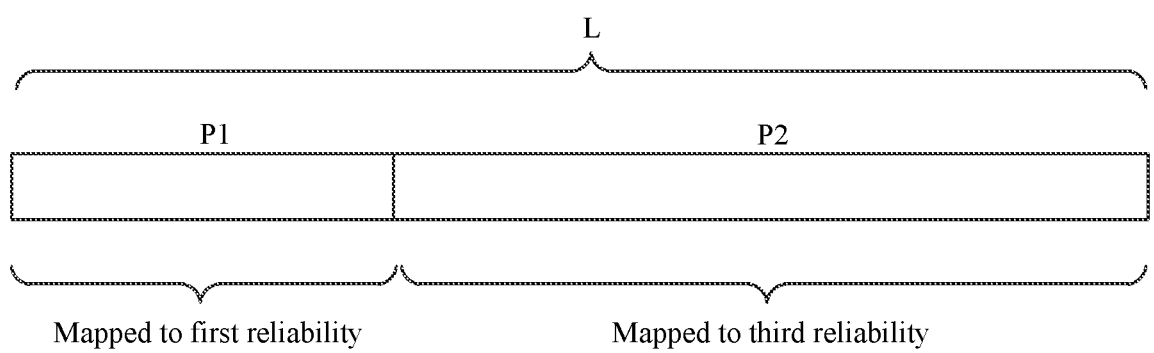

(8) The eighth prioritization manner is used to determine a priority of each bit field in the L to-be-sent bits. Therefore, a bit in a first parity bit field P1 is preferentially mapped to a bit location that is of the 64QAM modulation symbol and that has first reliability, that is, $I_0$ and/or $Q_0$ of 64QAM; and a bit in a second parity bit field P2 is mapped to a bit location that is of the 64QAM modulation symbol and that has second reliability, that is, $I_1$ and/or $Q_1$ of 64QAM, as shown in FIG. 11J. Alternatively, a bit in a first parity bit field P1 is mapped to a bit location that is of the 64QAM modulation symbol and that has first reliability, that is, $I_0$ and/or $Q_0$ of 64QAM; and a bit in a second parity bit field P2 is mapped to a bit location that is of the 64QAM modulation symbol and that has third reliability, that is, 12 and/or $Q_2$ of 64QAM, as shown in FIG. 11K.

Figure 11L:
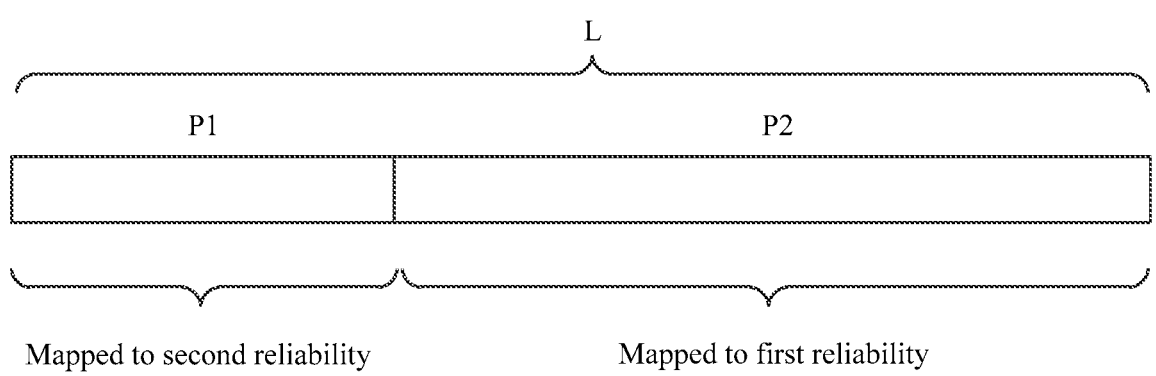

(9) The ninth prioritization manner is used to determine a priority of each bit field in the L to-be-sent bits. Therefore, a bit in a second parity bit field P2 is preferentially mapped to a bit location that is of the 64QAM modulation symbol and that has first reliability, that is, $I_0$ and/or $Q_0$ of 64QAM; and a bit in a first parity bit field P1 is mapped to a bit location that is of the 64QAM modulation symbol and that has second reliability, that is, $I_1$ and/or $Q_1$ of 64QAM, as shown in FIG. 11L. Alternatively, a bit in a second parity bit field P2 is mapped to a bit location that is of the 64QAM modulation symbol and that has first reliability, that is, $I_0$ and/or $Q_0$ of 64QAM; and a bit in a first parity bit field P1 is mapped to a bit location that is of the 64QAM modulation symbol and that has third reliability, that is, 12 and/or $Q_2$ of 64QAM, as shown in FIG. 11M.

(10) The tenth prioritization manner is used to determine a priority of each bit field in the L to-be-sent bits. Therefore, a bit in a second parity bit field P2 is preferentially mapped to a bit location that is of the 64QAM modulation symbol and that has first reliability, that is, $I_0$ and/or $Q_0$ of 64QAM; a bit in a first parity bit field P1 is mapped to a bit location that is of the 64QAM modulation symbol and that has second reliability, that is, $I_1$ and/or $Q_1$ of 64QAM; and a bit in an information bit field S is mapped to a bit location that is of the 64QAM modulation symbol and that has third reliability, that is, $I_2$ and/or $Q_2$ of 64QAM, as shown in FIG. 11N.

A specific mapping process is as follows:

L to-be-sent bits determined by the network device are $b_0$, $b_1$, K, $b_{L-1}$, and modulation symbols are $c_0$, $c_1$, K, $c_{LC-1}$, where $c_i$ represents at least one modulation symbol $(I_0(i)Q_0(i) \ldots I_{Lm-1}(i)Q_{Lm-1}(i))$, i=0, 1, K, LC−1, and LC is a symbol quantity of the modulation symbols to which the L to-be-sent bits are mapped, where $$LC = \frac{L}{Om}, Lm = \frac{Om}{2},$$

and Om is a modulation order. For example, modulation orders Om of QPSK, 16QAM, 64QAM, and 256QAM are 2, 4, 6, and 8 respectively. For example, when L=12, if 64QAM modulation symbols are used, the L to-be-sent bits need to be mapped to 12/6=2 64QAM modulation symbols; or if 16QAM modulation symbols are used, the L to-be-sent bits need to be mapped to 12/4=3 16QAM modulation symbols. For ease of description, bit locations $(I_0(i)Q_0(i) \ldots I_{Lm-1}(i)Q_{Lm-1}(i))$ of at least one modulation symbol may also be represented through an m-tuple of b(i), b(i+1), ..., b(i+m−2), and b(i+m−1) sometimes, where m is a quantity of bit locations of at least one modulation symbol, that is, a modulation order Om. For example, in a case of 64QAM, m=6; and in a case of 16QAM, m=4. $b(i)=I_0(i)$, $b(i+1)=Q_0(i)$, ..., $b(i+m-2)=I_{Lm-1}(i)$, and $b(i+m-1)=Q_{Lm-1}(i)$. The rest can be deduced by analogy. Therefore, bit locations b(i) and b(i+1) have first reliability, that is, highest reliability, bit locations b(i+2) and b(i+3) have second reliability, and bit locations b(i+m−2) and b(i+m−1) have lowest reliability. The following description is made by using an example in which L to-be-sent bits include an information bit field S, a first parity bit field P1, and a second parity bit field P2, a priority of the information bit field S is higher than a priority of the first parity bit field P1, the priority of the first parity bit field P1 is higher than a priority of the second parity bit field P2, L=12, and 64QAM modulation symbols are used.

When L=12, it can be learned based on $$LC = \frac{L}{Om}$$

that, 64QAM modulation symbols used for mapping are: $(I_0(0)Q_0(0)I_1(0)Q_1(0)I_2(0)Q_2(0))$ and $(I_0(1)Q_0(1)I_1(1)Q_1(1)I_2(1)Q_2(1))$, where a reliability level of bit locations $I_0(0)$, $Q_0(0)$, $I_0(1)$, and $Q_0(1)$ is first reliability, a reliability level of bit locations $I_1(0)$, $Q_1(0)$, $I_1(1)$, and $Q_1(1)$ is second reliability, and a reliability level of bit locations $I_2(0)$, $Q_2(0)$, $I_2(1)$, and $Q_2(1)$ is third reliability.

If in 12 to-be-sent bits, bits b0 to b3 are an information bit field, bits b4 to b7 are a first parity bit field, and bits b8 to b11 are a second parity bit field, the bits b0 to b3 are sequentially mapped to bit locations $I_0(0)$, $Q_0(0)$, $I_0(1)$, and $Q_0(1)$, the bits b4 to b7 are sequentially mapped to bit locations $I_1(0)$, $Q_1(0)$, $I_1(1)$, and $Q_1(1)$, and the bits b8 to b11 are sequentially mapped to bit locations $I_2(0)$, $Q_2(0)$, $I_2(1)$, and $Q_2(1)$, as shown in FIG. 12A; or the bits b0 to b3 are sequentially mapped to bit locations $I_0(0)$, $I_0(1)$, $Q_0(0)$, and $Q_0(1)$, the bits b4 to b7 are sequentially mapped to bit locations $I_1(0)$, $I_1(1)$, $Q_1(0)$, and $Q_1(1)$, and the bits b8 to b11 are sequentially mapped to bit locations $I_2(0)$, $I_2(1)$, $Q_2(0)$, and $Q_2(1)$, as shown in FIG. 12B.

If in 12 to-be-sent bits, bits b0 to b5 are an information bit field, bits b6 and b7 are a first parity bit field, and bits b8 to b11 are a second parity bit field, because bit locations having first reliability include only four bit locations $I_0(0)$, $Q_0(0)$, $I_0(1)$, and $Q_0(1)$, any two of the bits b0 to b5 are mapped to two bit locations having a reliability level only lower than the first reliability. For example, the two bits b4 and b5 may be mapped to bit locations $I_1(0)$ and $Q_1(0)$ whose reliability level is the second reliability, or the two bits b0 and b1 may be mapped to bit locations $I_1(1)$ and $Q_1(1)$ whose reliability level is the second reliability. For example, the bits b0 to b5 are sequentially mapped to bit locations $I_0(0)$, $Q_0(0)$, $I_0(1)$, $Q_0(1)$, $I_1(0)$, and $Q_1(0)$, the bits b6 and b7 are sequentially mapped to bit locations $I_1(1)$ and $Q_1(1)$, and the bits b8 to b11 are sequentially mapped to bit locations $I_2(0)$, $Q_2(0)$, $I_2(1)$, and $Q_2(1)$, as shown in FIG. 12A. Alternatively, the bits b0 to b5 are sequentially mapped to bit locations $I_0(0)$, $I_0(1)$, $Q_0(0)$, $Q_0(1)$, $I_1(0)$, and $I_1(1)$, the bits b6 and b7 are sequentially mapped to bit locations $Q_1(0)$ and $Q_1(1)$, and the bits b8 to b11 are sequentially mapped to bit locations $I_2(0)$, $I_2(1)$, $Q_2(0)$, and $Q_2(1)$, as shown in FIG. 12B.

If in 12 to-be-sent bits, bits b0 and b1 are an information bit field, bits b2 to b7 are a first parity bit field, and bits b8 to b11 are a second parity bit field, because a quantity of bits having the first priority is only two and four bit locations having the first reliability are included, any two bits that are of the bits b3 to b7 and whose priority is only lower than the first priority are mapped to two bit locations having the first reliability. For example, the two bits b3 and b4 may be mapped to bit locations $I_1(0)$ and $Q_1(0)$ whose reliability level is the first reliability, or the two bits b0 and b1 may be mapped to bit locations $I_1(1)$ and $Q_1(1)$ whose reliability level is the second reliability. For example, the bits b0 and b1 are sequentially mapped to bit locations $I_0(0)$ and $Q_0(0)$, the bits b2 to b7 are sequentially mapped to bit locations $I_0(1)$, $Q_0(1)$, $I_1(0)$, $Q_1(0)$, $I_1(1)$, and $Q_1(1)$, and the bits b8 to b11 are sequentially mapped to bit locations $I_2(0)$, $Q_2(0)$, $I_2(1)$, and $Q_2(1)$, as shown in FIG. 12A. Alternatively, the bits b0 and b1 are sequentially mapped to bit locations $I_0(0)$ and $I_0(1)$, the bits b2 to b7 are sequentially mapped to bit locations $Q_0(0)$, $Q_0(1)$, $I_1(0)$, $I_1(1)$, $Q_1(0)$, and $Q_1(1)$, and the bits b8 to b11 are sequentially mapped to bit locations $I_2(0)$, $I_2(1)$, $Q_2(0)$, and $Q_2(1)$, as shown in FIG. 12B.

In an example implementation, after determining locations of L to-be-sent bits based on a start location, the network device obtains the L to-be-sent bits, so that a bit that is in a bit field having a high priority and that is of the L to-be-sent bits may be mapped to a bit location that has high reliability and that is in at least one modulation symbol. To obtain intended mapping, before modulation and mapping, the L bits may be rearranged through an interleaver such as a row-column interleaver, so that an order of the rearranged bits conforms to an order of bit locations to which mapping is performed. A row-in and column-out interleaver may be used as the row-column interleaver. To be specific, an input sequence is written to the interleaver row by row, and is output column by column during output. Alternatively, a column-in and row-out interleaver may be used as the row-column interleaver, and an input sequence is written to the interleaver column by column, and is output row by row during output. If a quantity of bits read on a row or a column is a quantity of bit locations of at least one modulation symbol, a column quantity or a row quantity of the row-column interleaver may be the quantity of bit locations of the at least one modulation symbol, that is, a modulation order. For example, when 16QAM modulation is used, the modulation order is 4. If column-in and row-out is used, the column quantity may be 4, and four bits can be read on each row. If writing is performed column by column in an order from left to right, bits on two leftmost columns may be mapped to bit locations having highest reliability, and bits on two rightmost columns are mapped to bit location having lowest reliability. For another example, when 64QAM is used, the modulation order is 6. If row-in and column-out is used, the row quantity may be 6, and six bits can be read on each column. If writing is performed row by row in an order from top to bottom, bits on two uppermost rows may be mapped to bit locations having highest reliability, and bits on two lowermost rows may be mapped to bit locations having lowest reliability. In an example implementation, after determining L to-be-sent bits $e_0$, $e_1$, . . . , and $e_{L-1}$ based on a start location, the network device arranges these bits through the row-column interleaver whose row quantity or column quantity is Om to obtain L to-be-sent bits $f_0$, $f_1$, . . . , and $f_{L-1}$, so that bits that are in a bit field having a high priority and that are of the L to-be-sent bits, for example, first N bits may be preferentially mapped to bit locations that have high reliability and that are in at least one modulation symbol. It may be understood that, herein, bits are represented by using letters only for ease of description, or description may be made by using other letters and subscripts. Om is the modulation order, and when the modulation scheme is QPSK, Om=2; when the modulation scheme is 16QAM, Om=4; when the modulation scheme is 64QAM, Om=6; when the modulation scheme is 256QAM, Om=8; and so on. Using column-in and row-out as an example, the row-column interleaver has a column quantity of Om, and correspondingly a row quantity is L/Om, that is, a quantity LC of modulation symbols. It may be understood that, if L is not an integral multiple of Om, a padding bit may be inserted into the tail of the last column of the interleaver. In this way, the interleaver may process a bit sequence whose size is any integer. The bits $e_0$, $e_1$, . . . , and $e_{L-1}$ on the locations of the L to-be-sent bits are sequentially written to the interleaver by columns, and the following arranged L bits may be obtained:

the zeroth row: $e_0$, $e_{LC}$, $e_{2 \cdot LC}$, . . . , and $e_{(Om-1) \cdot LC}$ the first row: $e_1$, $e_{LC+1}$, $e_{2 \cdot LC+1}$, . . . , and $e_{(Om-1) \cdot LC+1}$

. . .

the $j^{th}$ row: $e_j$, $e_{LC+j}$, $e_{2 \cdot LC+j}$, . . . , and $e_{(Om-1) \cdot LC+j}$

. . .

It can be learned that, when reading is performed by rows, Om bits on each row correspond to Om bits of at least one modulation symbol. For example, $e_0$ and $e_{LC}$ on the zeroth row are mapped to two bit locations b(i) and b(i+1) that have the first reliability and that are in the zeroth modulation symbols, that is, $I_0(0)$ and $Q_0(0)$, $e_j$ and $e_{LC+1}$ on the first row are mapped to two bit locations b(i) and b(i+1) that have the first reliability and that are in the first modulation symbols, that is, $I_0(1)$ and $Q_0(1)$, and the rest can be deduced by analogy. It can be learned that, in the L to-be-sent bits, a bit arranged in front is preferentially mapped to a bit location having high reliability, and a bit arranged behind is mapped to a bit location having low reliability.

During initial transmission of the to-be-sent data block, the network device may set a priority of the information bit field to a highest priority, thereby mapping a bit in the information bit field to a bit location having a high reliability level, and reducing a bit error rate of the information bit field; and during retransmission, the network device may set a priority of the parity bit field to the highest priority, to reduce a bit error rate of the parity bit field, reduce a quantity of retransmission times, and reduce a delay, thereby improving transmission performance of the wireless communications system. In this embodiment of the present invention, to further reduce the bit error rate of the wireless communications system during data transmission, the network device may determine, through the foregoing two preset rules, a prioritization manner used during retransmission, and certainly may alternatively determine, by using another rule or manner, a prioritization manner used during retransmission. This is not limited in this application. To describe impact of the foregoing two preset rules on a mapping process, reference is made to FIG. 13A and FIG. 13B. FIG. 13A shows impact of the first preset rule on a mapping process, and FIG. 13B shows impact of the second preset rule on a mapping process. In FIG. 13A and FIG. 13B, L to-be-sent bits during each of a previous time of transmission and a next time of transmission include an information bit field S, a first parity bit field P1, and a second parity bit field P2, and L=24, where each of the information bit field S, the first parity bit field P1, and the second parity bit field P2 includes eight bits, and is mapped by using a 64QAM modulation symbol.

In FIG. 13A, during the previous time of transmission, the information bit field S, the first parity bit field P1, and the second parity bit field P2 are sequentially mapped to a bit location having first reliability, a bit location having second reliability, and a bit location having third reliability, where the bit locations are of the at least one modulation symbol; and during the next time of transmission, it is ensured that a reliability level of the bit location to which the information bit field S is mapped is unchanged, and the third prioritization manner is used, thereby mapping the first parity bit field P1 to the bit location having the third reliability and mapping the second parity bit field P2 to the bit location having the second reliability.

In FIG. 13B, during the previous time of transmission, the information bit field S, the first parity bit field P1, and the second parity bit field P2 are sequentially mapped to a bit location having first reliability, a bit location having second reliability, and a bit location having third reliability, where the bit locations are of the at least one modulation symbol; and during the next time of transmission, it is ensured that reliability levels of the bit locations to which the information bit field S, the first parity bit field P1, and the second parity bit field P2 are mapped are different from each other, and the sixth prioritization manner is used, thereby mapping the information bit field S to the bit location having the second reliability, mapping the first parity bit field P1 to the bit location having the third reliability, and mapping the second parity bit field P2 to the bit location having the first reliability.

It should be noted that, the mapping manners in FIG. 13A and FIG. 13B are only used to describe a specific implementation of the data processing method according to this embodiment of the present invention, and a person skilled in the art may alternatively use another specific implementation. This is not limited herein.

In an example implementation, before step 505, the method further includes step 506: sorting the L to-be-sent bits in descending priority order.

After the network device determines a priority of each bit field included in the L to-be-sent bits, the network device sorts the L to-be-sent bits, and arranges a bit field having a high priority preceding a bit field having a low priority. For example, the network device obtains the L to-be-sent bits shown in FIG. 9B, and an order of the bit fields of the L to-be-sent bits is sequentially the second parity bit field P2, the information bit field S, and the first parity bit field P1. The network device uses the second prioritization manner, and determines that the priority of the information bit field S is higher than the priority of the first parity bit field P1, and the priority of the first parity bit field P1 is higher than the priority of the second parity bit field P2. In this case, the network device sorts the L to-be-sent bits, to obtain the L to-be-sent bits shown in FIG. 10.

Then, the network device maps, based on the method of step 505, the L to-be-sent bits shown in FIG. 10 to the L bit locations of the at least one modulation symbol. Details are not repeated herein.

It should be noted that, step 506 is an optional step. To be specific, the sorting, by the network device, the L to-be-sent bits is an optional process, and does not have to be performed. After obtaining the L to-be-sent bits, the network device may directly map the L to-be-sent bits to the L bit locations of the at least one modulation symbol without sorting the L to-be-sent bits.

In an example implementation, during initial transmission of the to-be-sent data block, in the L to-be-sent bits obtained by the network device, the information bit field precedes the parity bit field, thereby mapping a bit in the information bit field to a bit location having a high reliability level; and during retransmission, in the L to-be-sent bits obtained by the network device, the parity bit field precedes the information bit field. For example, the initial bit sequence may be written to a cyclic buffer, and then a bit in the cyclic buffer begins to be read from a start location. The start location in the cyclic buffer may correspond to an information bit or a parity bit. During initial transmission, the L to-be-sent bits are read from the start location corresponding to the information bit, so that the information bit field precedes the parity bit field; and during retransmission, the L to-be-sent bits are read from the start location corresponding to the parity bit, so that the parity bit field precedes the information bit field.

Step 507: Output at least one modulation symbol generated after mapping.

After the network device maps the L to-be-sent bits to the L bit locations of the at least one modulation symbol, the at least one modulation symbol generated after mapping is obtained. For example, after 12 to-be-sent bits are mapped to 12 bit locations of a 64QAM modulation symbol, two 64QAM modulation symbols generated after mapping are obtained; and after 12 to-be-sent bits are mapped to 12 bit locations of a 16QAM modulation symbol, three 64QAM modulation symbols generated after mapping are obtained. During actual use, a person skilled in the art may select an appropriate modulation scheme based on a specific requirement of the wireless communications system. For example, if the wireless communications system requires relatively high spectral utilization, the 64QAM modulation scheme may be selected; and if the wireless communications system requires a relatively low bit error rate, the 16QAM modulation scheme may be selected. Examples are not listed one by one herein.

Step 508: Interleave, in a block interleaving manner, the at least one modulation symbol generated after mapping, to generate at least one interleaved modulation symbol.

To improve an error correction capability of the wireless communications system, after obtaining the at least one modulation symbol generated after mapping, the network device may further perform block interleaving on the at least one modulation symbol generated after mapping. In this embodiment of the present invention, a parameter of a row quantity and a column quantity of an interleaving matrix in the block interleaving manner is determined based on a length of a time scheduling unit and/or a symbol quantity of the at least one modulation symbol.

Specifically, the row quantity or the column quantity of the interleaving matrix may be determined in the following three manners:

First Manner:

The row quantity or the column quantity of the interleaving matrix is an integer closest to a square root of the symbol quantity of modulation symbols, that is, a value of the row quantity or the column quantity of the interleaving matrix is equal to $f(\sqrt{L_C})$, where $f(t)=t$, $f(t)=\lceil t \rceil$, or $f(t)=\lfloor t \rfloor$, t represents a parameter in the function, and $L_C$ is a quantity of symbols required for modulating the L to-be-sent bits. For example, when $L_C=12$, the row quantity or the column quantity of the interleaving matrix is equal to $f(\sqrt{12})=\lceil\sqrt{12}\rceil=4$.

Second Manner:

The row quantity or the column quantity of the interleaving matrix is equal to the length of the time scheduling unit, where the length of the time scheduling unit is represented by using a quantity of OFDM symbols that are included in the time scheduling unit and that are used to send the to-be-sent data block. For example, one slot includes six OFDM symbols, and therefore the row quantity or the column quantity of the interleaving matrix is 6.

Third Manner:

The row quantity or the column quantity of the interleaving matrix is an integer closest to a ratio of the symbol quantity of modulation symbols to the length of the time scheduling unit. To be specific, a value of the row quantity or the column quantity of the interleaving matrix is equal to $$f\left(\frac{Lc}{Ns}\right),$$

where $f(t)=t$, $f(t)=\lceil t \rceil$, or $f(t)=\lfloor t \rfloor$, t represents a parameter in the function, and Ns is the length of the time scheduling unit, and is represented by using a quantity of OFDM symbols that are included in the time scheduling unit and that are used to send the to-be-sent data block. For example, when $L_C=12$, one slot includes six OFDM symbols, and therefore the row quantity or the column quantity of the interleaving matrix is equal to $f(12/6)=2$.

It should be noted that, the network device may send, at a same moment, a plurality of groups of L to-be-sent bits generated by a plurality of groups of to-be-sent data blocks. In this case, a symbol quantity of modulation symbols used to determine the row quantity or the column quantity of the interleaving matrix is: a total quantity of modulation symbols required for mapping the plurality of groups of L to-be-sent bits to bit locations on the modulation symbols. For example, in two groups of L to-be-sent bits generated by two groups of to-be-sent data blocks, a bit quantity L of the first group of L to-be-sent bits generated by the first group of to-be-sent data blocks is equal to 12, and a bit quantity L of the second group of L to-be-sent bits generated by the second group of to-be-sent data blocks is equal to 12, and therefore a total quantity LC of 16QAM modulation symbols to which the two groups of L to-be-sent bits are mapped is equal to 3+3=6; or a bit quantity L of the first group of L to-be-sent bits generated by the first group of to-be-sent data blocks is equal to 24, and a bit quantity L of the second group of L to-be-sent bits generated by the second group of to-be-sent data blocks is equal to 36, and therefore a total quantity LC of 16QAM modulation symbols to which the two groups of L to-be-sent bits are mapped is equal to 6+9=15.

After determining the row quantity or the column quantity of the interleaving matrix, the network device performs block interleaving on $L_C$ modulation symbols based on the interleaving matrix. It should be noted that, when block interleaving is performed on the $L_C$ modulation symbols, the interleaving may be performed by using at least one modulation symbol as a minimum processing unit, or using a bit in at least one modulation symbol as a minimum processing unit. This is not limited in this embodiment of the present invention.

Using an example in which block interleaving is performed on the $L_C$ modulation symbols by using at least one modulation symbol as a minimum processing unit, after the network device determines to map one group of L to-be-sent bits to the $L_C$ modulation symbols, where for example, $L_C=16$, and the $L_C$ modulation symbols are respectively $C_0$, $C_1$, ..., and $C_{15}$, an interleaving matrix shown in FIG. 14 is obtained in a manner of writing by rows. In this case, the interleaving matrix has 16 elements in total, and each of a row quantity and a column quantity of the interleaving matrix is 4. Interleaved modulation symbols are obtained in a manner of reading by columns, and are sequentially $C_0$, $C_4$, $C_8$, $C_{12}$, $C_1$, $C_5$, $C_9$, $C_{13}$, $C_2$, $C_6$, $C_{10}$, $C_{14}$, $C_3$, $C_7$, $C_{11}$, and $C_{15}$, as shown in FIG. 15. Then, $C_0$, $C_4$, $C_8$, and $C_{12}$ are output onto four subcarriers of the first OFDM symbol, $C_1$, $C_5$, $C_9$, and $C_{13}$ are output onto four subcarriers of the second OFDM symbol, $C_2$, $C_6$, $C_{10}$, and $C_{14}$ are output onto four subcarriers of the third OFDM symbol, and $C_3$, $C_7$, $C_{11}$, and Cis are output onto four subcarriers of the fourth OFDM symbol, thereby obtaining four OFDM symbols, and sequentially transmitting the four OFDM symbols each including four subcarriers at four different moments respectively.

If the network device sends, at a same moment, two groups of modulation symbols corresponding to two groups of L to-be-sent bits generated by two groups of to-be-sent data blocks, where the first group of modulation symbols is $C_0$, $C_1$, $C_2$, $C_3$, $C_4$, $C_5$, $C_6$, and $C_7$, and the second group of modulation symbols is $C'_0$, $C'_2$, $C'_3$, $C'_4$, $C'_5$, $C'_6$, and $C'_7$. In this case, the two groups of modulation symbols are alternately read in a manner of writing by rows, to obtain an interleaving matrix shown in FIG. 16. The interleaving matrix has 16 elements in total, and each of a row quantity and a column quantity of the interleaving matrix is 4. Interleaved modulation symbols are obtained in a manner of reading by columns, and are sequentially $C_0$, $C'_0$, $C_4$, $C'_4$, $C_1$, $C'_1$, $C_5$, $C'_5$, $C_2$, $C'_2$, $C_6$, $C'_6$, $C_3$, $C'_3$, $C_7$, and $C'_7$, as shown in FIG. 17. Then, $C_0$, $C'_0$, $C_4$, and $C'_4$ are output onto four subcarriers of the first OFDM symbol, $C_1$, $C'_1$, $C_5$, and $C'_5$ are output onto four subcarriers of the second OFDM symbol, $C_2$, $C'_2$, $C_6$, and $C'_6$ are output onto four subcarriers of the third OFDM symbol, and $C_3$, $C'_3$, $C_7$, and $C'_7$ are output onto four subcarriers of the fourth OFDM symbol, thereby obtaining four OFDM symbols, and sequentially transmitting the four OFDM symbols each including four subcarriers at four different moments respectively.

In an example implementation, if a quantity of $L_C$ modulation symbols to which L to-be-sent bits are mapped cannot form a complete interleaving matrix, where for example, $L_C=14$, as shown in FIG. 18, last two elements in the interleaving matrix are empty, and interleaved modulation symbols are obtained in a manner of reading by columns, and are sequentially $C_0$, $C_4$, $C_8$, $C_{12}$, $C_1$, $C_5$, $C_9$, $C_{13}$, $C_2$, $C_6$, $C_{10}$, empty, $C_3$, $C_7$, $C_{11}$, and empty. Then, $C_0$, $C_4$, $C_8$, and $C_{12}$ are output onto four subcarriers of the first OFDM symbol, $C_1$, $C_5$, $C_9$, and $C_{13}$ are output onto four subcarriers of the second OFDM symbol, $C_2$, $C_6$, and $C_{10}$ are output onto three subcarriers of the third OFDM symbol, and $C_3$, $C_7$, and $C_{11}$ are output onto three subcarriers of the fourth OFDM symbol, thereby obtaining four OFDM symbols, and sequentially transmitting the four OFDM symbols at four different moments respectively.

It should be noted that, step 501 to step 504, step 506, and step 508 are optional steps, and do not have to be performed. To be specific, while reading L to-be-sent bits, the network device has learned a priority of a bit field included in the L to-be-sent bits, then directly preferentially maps a bit in a bit field having a high priority to a bit location that has high reliability and that is of at least one modulation symbol, and finally outputs the at least one modulation symbol.

Based on the data processing method provided in this embodiment of the present invention, by allocating an appropriate priority to each bit field of the to-be-sent bits, bit fields having different priorities are respectively mapped to different bit locations of at least one modulation symbol, and transmission reliability of important data during data transmission is preferentially improved with reference to a characteristic that the at least one modulation symbol has different reliability levels at different bit locations, thereby improving transmission performance of the wireless communications system.

Figure 19:
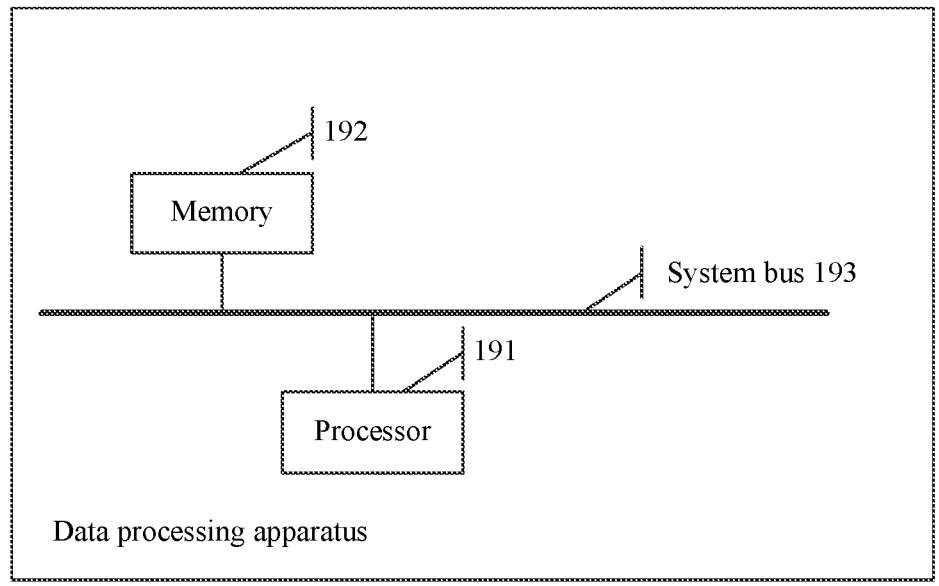
FIG. 19 to FIG. 21 are schematic structural diagrams of a data processing apparatus according to an embodiment of the present invention.

Referring to FIG. 19, an embodiment of the present invention provides a data processing apparatus that may be configured to perform the method according to the embodiments of the present invention. The data processing apparatus includes a processor 191.

The processor 191 may be a central processing unit (CPU) or an application-specific integrated circuit (ASIC), may be one or more integrated circuits configured to control program execution, or may be a baseband chip or the like.

The data processing apparatus may further include a memory 192 coupled to the processor 191, and the memory 192 may be connected to the processor 191 through a bus 193. There may be one or more memories 192, and the memory 192 may be a read-only memory (ROM), a random access memory (RAM), a magnetic disk storage, or the like. The memory 192 may be configured to store program code required by the processor 191 to perform a task, and the memory 192 may be further configured to store data.

The processor 191 is configured to map L to-be-sent bits to L bit locations included in at least one modulation symbol, where the L to-be-sent bits include at least one bit field, a bit in a bit field having a high priority is preferentially mapped to a bit location that is of the at least one modulation symbol and that has a high reliability level, the at least one bit field is at least one of an information bit field, a first parity bit field, and a second parity bit field, the information bit field is a bit sequence the same as a to-be-sent data block or a bit sequence obtained by performing weighted-type transform processing on a to-be-sent data block, the first parity bit field is a bit field obtained by encoding the to-be-sent data block by using a first part of an encoding matrix, and the second parity bit field is a bit field obtained by encoding the to-be-sent data block by using a second part of the encoding matrix; and output the at least one modulation symbol.

In an example design, the memory 192 stores a prioritization manner of the at least one bit field, and the prioritization manner of the at least one bit field is:

a priority of the information bit field is a first priority, a priority of the parity bit field is a second priority, the first priority is higher than the second priority, and the parity bit field includes the first parity bit field and/or the second parity bit field;

a priority of the information bit field is a first priority, a priority of the first parity bit field is a second priority, a priority of the second parity bit field is a third priority, the first priority is higher than the second priority, and the second priority is higher than the third priority;

a priority of the information bit field is a first priority, a priority of the parity bit field is a second priority, the first priority is higher than the second priority, and the parity bit field includes the first parity bit field and/or the second parity bit field;

a priority of the first parity bit field is a first priority, a priority of the second parity bit field is a second priority, a priority of the information bit field is a third priority, the first priority is higher than the second priority, and the second priority is higher than the third priority;

a priority of the second parity bit field is a first priority, a priority of the information bit field is a second priority, a priority of the first parity bit field is a third priority, the first priority is higher than the second priority, and the second priority is higher than the third priority;

a priority of the first parity bit field is a first priority, a priority of the information bit field is a second priority, a priority of the second parity bit field is a third priority, the first priority is higher than the second priority, and the second priority is higher than the third priority;

a priority of the first parity bit field is a first priority, a priority of the second parity bit field is a second priority, and the first priority is higher than the second priority;

a priority of the second parity bit field is a first priority, a priority of the first parity bit field is a second priority, and the first priority is higher than the second priority; or a priority of the second parity bit field is a first priority, a priority of the first parity bit field is a second priority, a priority of the information bit field is a third priority, the first priority is higher than the second priority, and the second priority is higher than the third priority.

In an example design, if the L to-be-sent bits are bits that need to be sent when the to-be-sent data block is retransmitted, the prioritization manner of the at least one bit field included in the L to-be-sent bits is different from a prioritization manner used when the to-be-sent data block is initially transmitted, or the prioritization manner of the at least one bit field included in the L to-be-sent bits is different from a prioritization manner used when the to-be-sent data block is transmitted last time.

In an example design, the processor 191 is specifically configured to:

sort the L to-be-sent bits in descending priority order; and map the sorted L to-be-sent bits to the L bit locations of the at least one modulation symbol.

In an example design, the processor 191 is further configured to:

interleave the at least one modulation symbol in a block interleaving manner, to generate at least one interleaved modulation symbol, where a parameter of a row quantity and a column quantity of an interleaving matrix used in the block interleaving manner is determined based on a length of a time scheduling unit and/or a symbol quantity of the at least one modulation symbol.

By designing and programming the processor 191, code corresponding to the foregoing data processing method is solidified into a chip, so that during running, the chip can perform the foregoing data processing method. How to design and program the processor 191 is a technology publicly known by a person skilled in the art. Details are not repeated herein.

Figure 20:
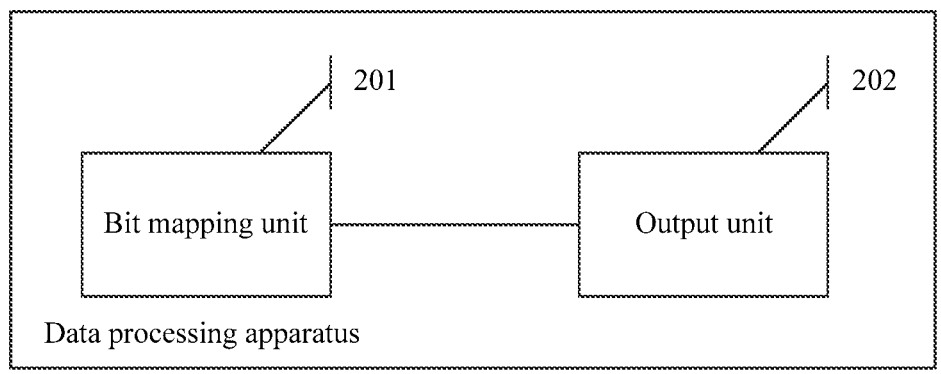

Referring to FIG. 20, an embodiment of the present invention provides a data processing apparatus. The data processing apparatus includes a bit mapping unit 201 and an output unit 202.

In actual application, a physical device corresponding to the bit mapping unit 201 and the output unit 202 may be the processor 191 in FIG. 19.

The bit mapping unit 201 is configured to map L to-be-sent bits to L bit locations included in at least one modulation symbol, where the L to-be-sent bits include at least one bit field, a bit in a bit field having a high priority is preferentially mapped to a bit location that is of the at least one modulation symbol and that has a high reliability level, the at least one bit field is at least one of an information bit field, a first parity bit field, and a second parity bit field, the information bit field is a bit sequence the same as a to-be-sent data block or a bit sequence obtained by performing weighted-type transform processing on a to-be-sent data block, the first parity bit field is a bit field obtained by encoding the to-be-sent data block by using a first part of an encoding matrix, and the second parity bit field is a bit field obtained by encoding the to-be-sent data block by using a second part of the encoding matrix.

The output unit 202 is configured to output the at least one modulation symbol.

In an example design, a prioritization manner of the at least one bit field is:

a priority of the information bit field is a first priority, a priority of the parity bit field is a second priority, the first priority is higher than the second priority, and the parity bit field includes the first parity bit field and/or the second parity bit field;

a priority of the information bit field is a first priority, a priority of the first parity bit field is a second priority, a priority of the second parity bit field is a third priority, the first priority is higher than the second priority, and the second priority is higher than the third priority;

a priority of the information bit field is a first priority, a priority of the second parity bit field is a second priority, a priority of the first parity bit field is a third priority, the first priority is higher than the second priority, and the second priority is higher than the third priority;

a priority of the parity bit field is a first priority, a priority of the information bit field is a second priority, the first priority is higher than the second priority, and the parity bit field includes the first parity bit field and/or the second parity bit field;

a priority of the first parity bit field is a first priority, a priority of the second parity bit field is a second priority, a priority of the information bit field is a third priority, the first priority is higher than the second priority, and the second priority is higher than the third priority;

a priority of the second parity bit field is a first priority, a priority of the information bit field is a second priority, a priority of the first parity bit field is a third priority, the first priority is higher than the second priority, and the second priority is higher than the third priority;

a priority of the first parity bit field is a first priority, a priority of the information bit field is a second priority, a priority of the second parity bit field is a third priority, the first priority is higher than the second priority, and the second priority is higher than the third priority;

a priority of the first parity bit field is a first priority, a priority of the second parity bit field is a second priority, and the first priority is higher than the second priority;

a priority of the second parity bit field is a first priority, a priority of the first parity bit field is a second priority, and the first priority is higher than the second priority; or a priority of the second parity bit field is a first priority, a priority of the first parity bit field is a second priority, a priority of the information bit field is a third priority, the first priority is higher than the second priority, and the second priority is higher than the third priority.

In an example design, if the L to-be-sent bits are bits that need to be sent when the to-be-sent data block is retransmitted, the prioritization manner of the at least one bit field included in the L to-be-sent bits is different from a prioritization manner used when the to-be-sent data block is initially transmitted, or the prioritization manner of the at least one bit field included in the L to-be-sent bits is different from a prioritization manner used when the to-be-sent data block is transmitted last time.

In an example design, the bit mapping unit 201 is specifically configured to:

sort the L to-be-sent bits in descending priority order; and map the sorted L to-be-sent bits to the L bit locations of the at least one modulation symbol.

Figure 21:
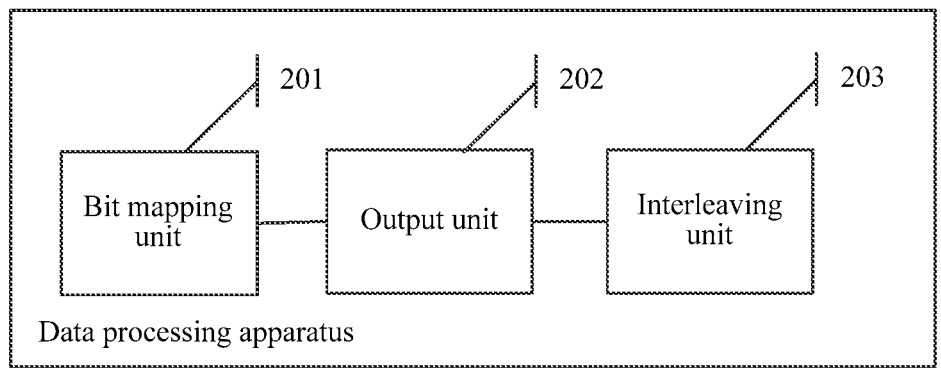

In an example design, referring to FIG. 21, the data processing apparatus further includes:

an interleaving unit 203, configured to interleave the at least one modulation symbol in a block interleaving manner, to generate at least one interleaved modulation symbol, where a parameter of a row quantity and a column quantity of an interleaving matrix used in the block interleaving manner is determined based on a length of a time scheduling unit and/or a symbol quantity of the at least one modulation symbol.

For a specific implementation of operations performed by the bit mapping unit 201, the output unit 202, and the interleaving unit 203 included in the data processing apparatus shown in FIG. 20 and FIG. 21, refer to corresponding steps when the foregoing data processing method is performed. Details are not repeated herein.

The data processing apparatus provided in this application may be a network device, for example, a wireless access device having a data processing function such as a base station or a transmission reception point (TRP), or may be the terminal device in this application.

The data processing apparatus provided in this application may be a chip system, and the chip system may include at least one chip, or may include another discrete device. The chip system may be placed in a network device or a terminal device, to support the network device or the terminal device in completing the data processing method provided in the embodiments of this application.

An embodiment of the present invention provides a computer storage medium. The computer storage medium stores an instruction, and when the instruction is run on a computer, the computer is enabled to perform the foregoing data processing method.

An embodiment of the present invention provides a computer program product. The computer program product includes an instruction, and when the instruction is run on a computer, the computer is enabled to perform the foregoing data processing method.

In the embodiments of the present invention, the data processing apparatus allocates an appropriate priority to each bit field of the to-be-sent bits, bit fields having different priorities are respectively mapped to different bit locations of at least one modulation symbol, and transmission reliability of important data during data transmission is preferentially improved with reference to a characteristic that the at least one modulation symbol has different reliability levels at different bit locations, thereby improving transmission performance of the wireless communications system.

All or some of the foregoing embodiments of the present invention may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or other programmable apparatuses. The computer instructions may be stored in a computer-readable storage medium or may be transmitted from a computer-readable storage medium to another readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive Solid State Disk (SSD)), or the like.

The foregoing embodiments are merely used to describe the technical solutions of the embodiments of the present invention. The foregoing embodiments are merely intended to help understand the method and core ideas of the embodiments of the present invention, and shall not be construed as a limitation on this application. Any variation or replacement readily figured out by a person skilled in the art within the technical scope disclosed in the embodiments of the present invention shall fall within the protection scope of the embodiments of the present invention.

What is claimed is:

1. A data processing method by a wireless access device in a communication network, the method comprising:
   mapping L to-be-sent bits to L bit locations comprised in L/Om modulation symbols, wherein the L to-be-sent bits comprise an information bit field and a parity bit field, wherein each of the modulation symbols corresponds to Om bit locations, and in a retransmission process, a bit location of the L bit locations for mapping a bit in the parity bit field has higher reliability than a bit location of the L bit locations for mapping a bit in the information bit field;
   outputting the modulation symbols; and
   wherein in the Om bit locations corresponding to each modulation symbol to which the information bit field and the parity bit field are mapped, a bit in the parity bit field is mapped to a location preceding a location to which a bit in the information bit field is mapped;
   wherein in the Om bit locations corresponding to a modulation symbol with the bit locations ranging from $I_0Q_0$ to $I_{Lm-1}Q_{Lm-1}$, $I_0$ and $Q_0$ have a highest reliability level, and $I_{Lm-1}$ and $Q_{Lm-1}$ have a lowest reliability level, and wherein $$Lm = \frac{Om}{2}.$$

2. The method according to claim 1, wherein in an initial transmission process, a bit location of the L bit locations for mapping a bit in the information bit field has higher reliability than a bit location of the L bit locations for mapping a bit in the parity bit field.

3. The method according to claim 1, wherein in an initial transmission process, in Om bit locations corresponding to each modulation symbol to which the information bit field and the parity bit field are mapped, a bit in the information bit field is mapped to a location preceding a location to which a bit in the parity bit field is mapped.

4. The method according to claim 3, wherein in the Om bit locations corresponding to the modulation symbol with the bit locations ranging from $I_0Q_0$ to $I_{Lm-1}Q_{Lm-1}$, $I_0$ and $Q_0$ have a highest reliability level, and $I_{Lm-1}$ and $Q_{Lm-1}$ have a lowest reliability level, and wherein $$Lm = \frac{Om}{2}.$$

5. The method according to claim 1, wherein the method further comprises:
   obtaining the L to-be-sent bits, wherein in the L to-be-sent bits, the information bit field precedes the parity bit field, or the parity bit field is arranged preceding the information bit field.

6. The method according to claim 1, wherein the mapping L to-be-sent bits to L bit locations comprised in at least one modulation symbol comprises:
   rearranging the L to-be-sent bits through a row-column interleaver; and
   mapping the rearranged bits to the L bit locations.

7. The method according to claim 6, wherein a row quantity of the row-column interleaver is a modulation order or a column quantity of the row-column interleaver is a modulation order.

8. The method according to claim 1, wherein:
   a modulation scheme of the modulation symbols is 16QAM, the modulation order is 4, and the L bit locations have two reliability levels;
   a modulation scheme of the modulation symbols is 64QAM, the modulation order is 6, and the L bit locations have three reliability levels; or
   a modulation scheme of the modulation symbols is 256QAM, the modulation order is 8, and the L bit locations have four reliability levels.

9. A data processing apparatus, comprising:
   a processor; and
   a non-transitory computer-readable storage medium coupled to the processor and storing processor executable instructions, which when executed by the processor, cause the data processing apparatus to:
   map L to-be-sent bits to L bit locations comprised in L/Om modulation symbols, wherein the L to-be-sent bits comprise an information bit field and a parity bit field, wherein each of the modulation symbols corresponds to Om bit locations, and in a retransmission process, a bit location of the L bit locations for mapping a bit in the parity bit field has higher reliability than a bit location of the L bit locations for mapping a bit in the information bit field; and
   output the modulation symbols; and
   wherein in the Om bit locations corresponding to each modulation symbol to which the information bit field and the parity bit field are mapped, a bit in the parity bit field is mapped to a location preceding a location to which a bit in the information bit field is mapped;

wherein in the Om bit locations corresponding to a modulation symbol with the bit locations ranging from $I_0Q_0$ to $I_{Lm-1}Q_{Lm-1}$, $I_0$ and $Q_0$ have a highest reliability level, and $I_{Lm-1}$ and $Q_{Lm-1}$ have a lowest reliability level, and wherein $$Lm = \frac{Om}{2}.$$

10. The apparatus according to claim 9, wherein in an initial transmission process, a bit location of the L bit locations for mapping a bit in the information bit field has higher reliability than a bit location of the L bit locations for mapping a bit in the parity bit field.

11. The apparatus according to claim 9, wherein in an initial transmission process, in Om bit locations corresponding to each modulation symbol to which the information bit field and the parity bit field are mapped, a bit in the information bit field is mapped to a location preceding a location to which a bit in the parity bit field is mapped.

12. The apparatus according to claim 11, wherein in the Om bit locations corresponding to the modulation symbol with the bit locations ranging from $I_0Q_0$ to $I_{Lm-1}Q_{Lm-1}$, $I_0$ and $Q_0$ have a highest reliability level, and $I_{Lm-1}$ and $Q_{Lm-1}$ have a lowest reliability level, and wherein $$Lm = \frac{Om}{2}.$$

13. The apparatus according to claim 9, wherein the processor executable instructions further cause the apparatus to:

obtain the L to-be-sent bits, wherein in the L to-be-sent bits, the information bit field precedes the parity bit field, or the parity bit field precedes the information bit field.

14. The apparatus according to claim 9, wherein the processor executable instructions cause the apparatus to:

rearrange the L to-be-sent bits through a row-column interleaver; and map the rearranged bits to the L bit locations.

15. The apparatus according to claim 14, wherein a row quantity of the row-column interleaver is a modulation order or a column quantity of the row-column interleaver is a modulation order.

16. The apparatus according to claim 9, wherein:

a modulation scheme of the modulation symbols is 16QAM, the modulation order is 4, and the L bit locations have two reliability levels;

a modulation scheme of the modulation symbols is 64QAM, the modulation order is 6, and the L bit locations have three reliability levels; or a modulation scheme of the modulation symbols is 256QAM, the modulation order is 8, and the L bit locations have four reliability levels.

* * * * *